(12) United States Patent
Goto et al.

(10) Patent No.: US 8,476,991 B2
(45) Date of Patent: Jul. 2, 2013

(54) ELASTIC WAVE RESONATOR, ELASTIC WAVE FILTER, AND ANTENNA SHARING DEVICE USING THE SAME

(75) Inventors: Rei Goto, Osaka (JP); Yosuke Hamaoka, Osaka (JP); Hiroyuki Nakamura, Osaka (JP); Tetsuya Tsurunari, Osaka (JP); Joji Fujiwara, Osaka (JP)

(73) Assignee: Panasonic Corporation, Osaka (JP)

( * ) Notice: Subject to any disclaimer, the term of this patent is extended or adjusted under 35 U.S.C. 154(b) by 594 days.

(21) Appl. No.: 12/757,475

(22) Filed: Apr. 9, 2010

(65) Prior Publication Data

US 2010/0194496 A1 Aug. 5, 2010

Related U.S. Application Data

(63) Continuation-in-part of application No. PCT/JP2008/003173, filed on Nov. 5, 2008.

(30) Foreign Application Priority Data

| Nov. 6, 2007 | (JP) | 2007-288351 |
| Nov. 15, 2007 | (JP) | 2007-296523 |
| Apr. 13, 2009 | (JP) | 2009-096831 |

(51) Int. Cl.
*H03H 9/54* (2006.01)
*H03H 9/64* (2006.01)

(52) U.S. Cl.
USPC .......................... 333/193; 333/195

(58) Field of Classification Search
USPC .......................... 333/193, 195, 133
See application file for complete search history.

(56) References Cited

U.S. PATENT DOCUMENTS

| 6,441,704 B1 | 8/2002 | Ali-Hackl et al. |
| 6,771,145 B2 * | 8/2004 | Ouchi et al. ............... 333/195 |
| 7,795,999 B2 * | 9/2010 | Kaneda et al. ............. 333/193 |
| 2002/0140316 A1 | 10/2002 | Yamanouchi |
| 2002/0163403 A1 | 11/2002 | Sawada et al. |

(Continued)

FOREIGN PATENT DOCUMENTS

| CN | 1294781 A | 5/2001 |
| JP | 05-335879 A | 12/1993 |

(Continued)

OTHER PUBLICATIONS

International Search Report for International Application No. PCT/JP2008/003173, dated Feb. 3, 2009, 2 pages.

*Primary Examiner* — Dean O Takaoka
*Assistant Examiner* — Alan Wong
(74) *Attorney, Agent, or Firm* — Brinks Hofer Gilson & Lione

(57) ABSTRACT

An acoustic wave resonance device includes: piezoelectric substrate (1), first acoustic wave resonator (100) provided on an upper surface of piezoelectric substrate (1) and including first interdigital transducer electrode (110), and second acoustic wave resonator (200) provided on piezoelectric substrate (1) and including second interdigital transducer electrode (210). First acoustic wave resonator (100) and second acoustic wave resonator (200) are connected to each other. An overlap width of a plurality of first comb-shaped electrodes (112) forming first acoustic wave resonator (100) is larger than an overlap width of a plurality of second comb-shaped electrodes (212) forming second acoustic wave resonator (200). With such a configuration, frequencies in which a transverse mode spurious response is generated can be distributed and loss can be reduced.

9 Claims, 19 Drawing Sheets

U.S. PATENT DOCUMENTS

| | | |
|---|---|---|
| 2005/0046520 A1 | 3/2005 | Nishizawa et al. |
| 2005/0134407 A1 | 6/2005 | Anasako et al. |
| 2010/0164646 A1 | 7/2010 | Nakanishi et al. |

FOREIGN PATENT DOCUMENTS

| | | |
|---|---|---|
| JP | 09-205343 A | 8/1997 |
| JP | 09-294049 A | 11/1997 |
| JP | 10-084245 A | 3/1998 |
| JP | 2000-077972 A | 3/2000 |
| JP | 2002-290205 A | 10/2002 |
| JP | 2003-133902 A | 5/2003 |
| JP | 2003-209458 A | 7/2003 |
| JP | 2003-249841 A | 9/2003 |
| JP | 2007-221416 A | 8/2007 |

* cited by examiner

ELASTIC WAVE RESONATOR, ELASTIC WAVE FILTER, AND ANTENNA SHARING DEVICE USING THE SAME

RELATED APPLICATIONS

This application is a continuation-in-part of PCT/JP2008/003173 filed on Nov. 5, 2008 which claims priority under 35 U.S.C. §119 to Japanese Patent Application Nos. 2007-288351 filed on Nov. 6, 2007 and 2007-296523 filed Nov. 15, 2007. This application also claims priority to Japanese Patent Application No. 2009-096831 filed on Apr. 13, 2009. The entire contents of these applications are hereby incorporated by reference.

BACKGROUND OF THE INVENTION

1. Field of the Invention

The present invention relates to an acoustic wave filter used in mobile communication equipment and the like.

2. Description of the Related Art

As a conventional acoustic wave filter, as shown in FIG. 19, for example, a configuration in which three acoustic wave resonators D, E, and F are connected in series has been known. With such a configuration, a voltage applied to each pair of comb-shaped electrode fingers is reduced and a mechanical stress intensively applied is distributed so as to improve power durability (see Patent Document 1).

However, such a conventional acoustic wave filter in which a plurality of stages of acoustic wave resonators are connected in series has a problem that loss due to spurious responses is large.

When acoustic wave resonators D, E, and F having an equal overlap width are cascade-connected, if a transverse mode spurious response occurs in acoustic wave resonators D, E, and F, respectively, the spurious responses appear in the same frequency with respect to acoustic wave resonators D, E, and F. Consequently, the transverse mode spurious responses of acoustic wave resonators D, E, and F are strengthened by each other, thus increasing loss in the pass band.

This state is shown in FIGS. 20 and 21. FIG. 20 is a graph showing an admittance characteristic of the conventional acoustic wave resonator shown in FIG. 19. FIG. 12 is a graph showing a pass characteristic of the acoustic wave resonator. As shown in these graphs, deep transverse mode spurious responses S are largely generated between resonance frequency A and anti-resonant frequency B. As a result, loss in the pass band becomes large in the portions in which transverse mode spurious responses S are generated.

Furthermore, as a conventional acoustic wave filter, as shown in FIG. 22, for example, a configuration in which three acoustic wave resonators G, H, and I are connected in parallel is known. With such a configuration, the bandwidth of the pass band can be widened (see Patent Document 2).

However, such a conventional acoustic wave filter in which a plurality of stages of acoustic wave resonators are connected in parallel also has a problem that loss due to spurious responses is large.

When acoustic wave resonators G, H, and I having an equal overlap width are connected in parallel, if a transverse mode spurious response occurs in acoustic wave resonators G, H, and I, respectively, the spurious responses appear in the same frequency with respect to acoustic wave resonators G, H, and I. Consequently, the transverse mode spurious responses of acoustic wave resonators G, H, and I are strengthened by each other, thus increasing loss in the pass band.

This state is shown in FIGS. 23 and 24. FIG. 23 is a graph showing an admittance characteristic of the conventional acoustic wave resonator shown in FIG. 22. FIG. 24 is a graph showing a pass characteristic of the acoustic wave resonator. As shown in these graphs, deep transverse mode spurious responses S are largely generated between resonance frequency A and anti-resonant frequency B. As a result, similar to the case of cascade connection, loss in the pass band becomes large in the portions in which transverse mode spurious response S are generated.

Patent Document 1: Japanese Patent Unexamined Publication No. H9-205343

Patent Document 2: Japanese Patent Unexamined Publication No. 2000-77972

SUMMARY OF THE INVENTION

The present invention relates to an acoustic wave resonance device and an acoustic wave filter in which loss due to spurious responses is suppressed, and an antenna duplexer using the same.

An acoustic wave resonance device of the present invention includes a piezoelectric substrate, a first acoustic wave resonator provided on an upper surface of the piezoelectric substrate and including a first interdigital transducer electrode, and a second acoustic wave resonator having a second provided on the upper surface of the piezoelectric substrate and including a second interdigital transducer electrode. The first acoustic wave resonator and the second acoustic wave resonator are connected to each other. An overlap width of a plurality of first comb-shaped electrodes forming the first acoustic wave resonator is larger than an overlap width of a plurality of second comb-shaped electrodes forming the second acoustic wave resonator.

With such a configuration, it is possible to achieve a low-loss acoustic wave resonance device that is less affected by a transverse mode spurious response.

DETAILED DESCRIPTION OF THE PREFERRED EMBODIMENTS

Hereinafter, exemplary embodiments of the present invention are described with reference to drawings. Note here that the present invention is not necessarily limited to these exemplary embodiments.

First Exemplary Embodiment

Figure 1:
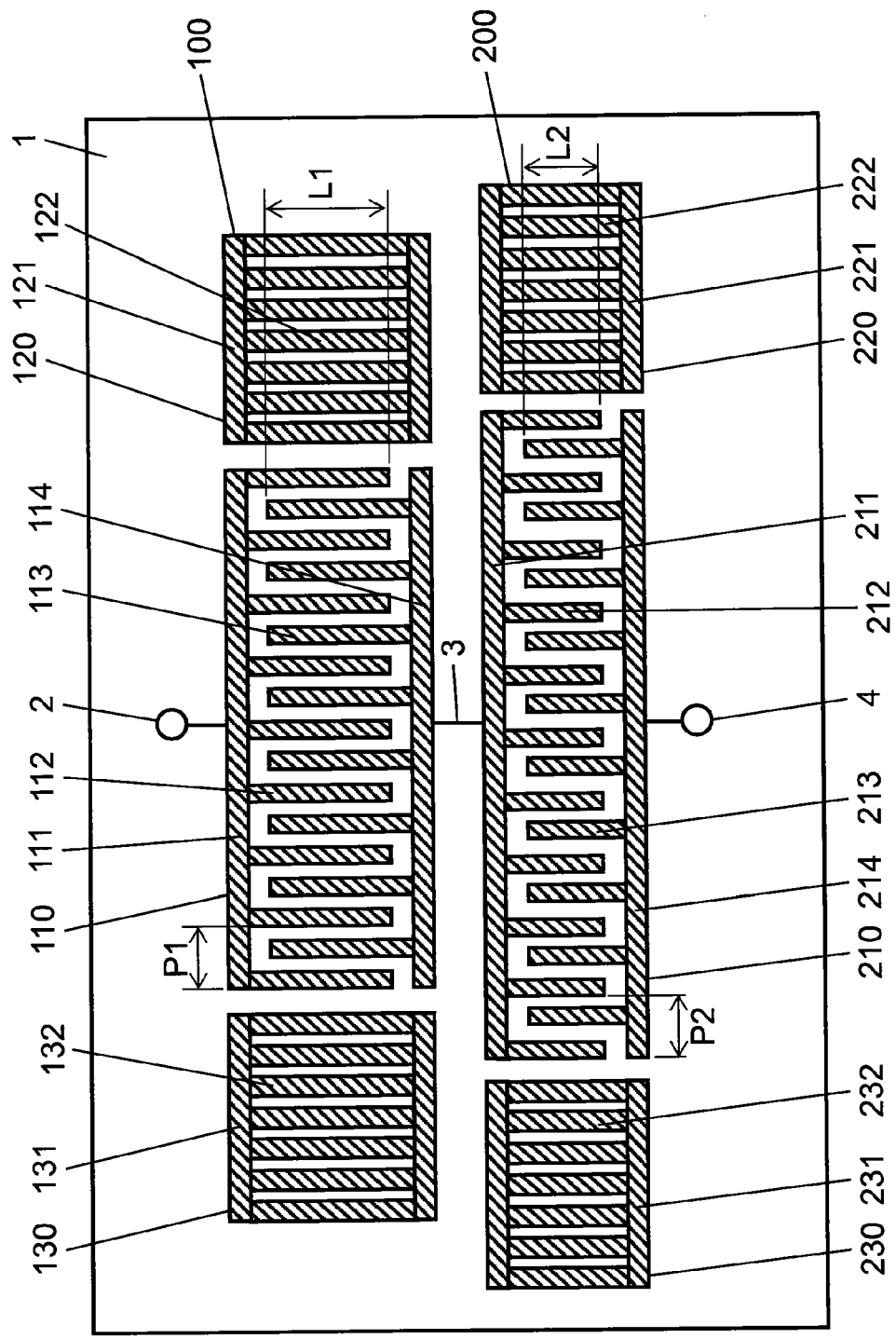
FIG. 1 is a top view showing an acoustic wave resonance device in accordance with a first exemplary embodiment of the present invention.

FIG. 1 is a top view showing an acoustic wave resonance device in accordance with a first exemplary embodiment of the present invention. As shown in FIG. 1, the acoustic wave resonance device of this exemplary embodiment includes piezoelectric substrate 1 made of lithium niobate, and first acoustic wave resonator 100 and second acoustic wave resonator 200 provided on an upper surface of piezoelectric substrate 1. First acoustic wave resonator 100 and second acoustic wave resonator 200 are cascade-connected.

First acoustic wave resonator 100 includes interdigital transducer electrode 110 and grating reflectors 120 and 130. Grating reflectors 120 and 130 are disposed such that they sandwich interdigital transducer electrode 110 therebetween on an acoustic wave propagation path.

Interdigital transducer electrode 110 includes bus bar 111 and a plurality of comb-shaped electrodes 112 that have the same length and are electrically connected to each other to bus bar 111. Comb-shaped electrodes 112 are provided on bus bar 111 at an interval of P1. Furthermore, interdigital transducer electrode 110 includes a plurality of comb-shaped electrodes 113 that have the same length and are electrically connected to each other to bus bar 114. Comb-shaped electrodes 113 are provided on bus bar 114 at an interval of P1. Comb-shaped electrode 112 and comb-shaped electrode 113 are disposed alternately and overlapped with an overlap width (a length in which two comb-shaped electrodes are overlapped with each other) of L1. Bus bar 111 is electrically connected to input terminal 2.

Grating reflector 120 includes a plurality of comb-shaped electrodes 122 electrically connected to bus bar 121. Comb-shaped electrodes 122 are provided on bus bar 121 at an interval of P1/2. Grating reflector 130 includes a plurality of comb-shaped electrodes 132 electrically connected to bus bar 131. Comb-shaped electrodes 132 are provided on bus bar 131 at an interval of P1/2.

Similarly, second acoustic wave resonator 200 includes interdigital transducer electrode 210 and grating reflectors 220 and 230. Grating reflectors 220 and 230 are disposed such that they sandwich interdigital transducer electrode 210 therebetween on an acoustic wave propagation path.

Interdigital transducer electrode 210 includes a plurality of comb-shaped electrodes 212 electrically connected to bus bar 211. Comb-shaped electrodes 212 are provided on bus bar 211 at an interval of P2. Furthermore, interdigital transducer electrode 210 includes a plurality of comb-shaped electrodes 213 electrically connected to bus bar 214. Comb-shaped electrodes 213 are provided on bus bar 214 at an interval of P2. Comb-shaped electrode 212 and comb-shaped electrode 213 are disposed alternately and overlapped with an overlap width of L2. Overlap width L2 of comb-shaped electrodes 212 and 213 is smaller than overlap width L1 of first acoustic wave resonator 100. Bus bar 214 is electrically connected to output terminal 4.

Grating reflector 220 includes a plurality of comb-shaped electrodes 222 electrically connected to bus bar 221. Comb-shaped electrodes 222 are provided on bus bar 221 at an interval of P2/2. Grating reflector 230 includes a plurality of comb-shaped electrodes 232 electrically connected to bus bar 231. Comb-shaped electrodes 232 are provided on bus bar 231 at an interval of P2/2.

First acoustic wave resonator 100 and second acoustic wave resonator 200 are electrically connected to each other via connection line 3 so as to form a cascade connection. Note here that connection line 3 may be omitted, and bus bar 114 and bus bar 211 may be directly connected to each other. In this case, since connection line 3 can be omitted, an acoustic wave resonator can be miniaturized.

Thus, when overlap width L1 of comb-shaped electrodes 112 and 113 of interdigital transducer electrode 110 forming first acoustic wave resonator 100 is allowed to be different from overlap width L2 of comb-shaped electrodes 212 and 213 of interdigital transducer electrode 210 forming second acoustic wave resonator 200, the below-mentioned effects can be obtained.

When an acoustic wave resonator formed on piezoelectric substrate 1 made of lithium niobate is used, generation of transverse mode spurious responses is one of the causes deteriorating the resonator performance. The transverse mode spurious response is a spurious response generated in the pass band, which is caused by an occurrence of a standing wave in the direction perpendicular to the acoustic wave propagation direction. Herein, when first acoustic wave resonator 100 and second acoustic wave resonator 200 have an equal overlap width as in a conventional example, frequencies in which a transverse mode spurious response is generated coincide with each other as mentioned above. As a result, a deep spurious response is generated in the pass band, thus causing loss.

Furthermore, when first acoustic wave resonator 100 and second acoustic wave resonator 200 are not acoustically coupled to each other, frequencies in which the transverse mode spurious response is generated are completely coincide with each other, and therefore, the problem of loss is serious.

However, in this exemplary embodiment, overlap width L1 and overlap width L2 are allowed to be different from each other. The present applicant has found that by allowing overlap width L1 and overlap width L2 to be different from each other, generation of transverse mode spurious responses can be distributed in different frequency ranges between first acoustic wave resonator 100 and second acoustic wave resonator 200.

That is to say, frequencies in which a spurious response is generated can be effectively distributed by varying an overlap width for each acoustic wave resonator. As a result, it is possible to achieve a low-loss acoustic wave resonance device that is less affected by transverse mode spurious responses. Furthermore, unlike a configuration by apodization the propagation path of each acoustic wave resonator is not prevented by a dummy electrode, and deterioration of Q value is not caused. Thus, it is possible to obtain an acoustic wave resonance device which has excellent characteristics and in which loss is reduced in the pass band.

Figure 2:
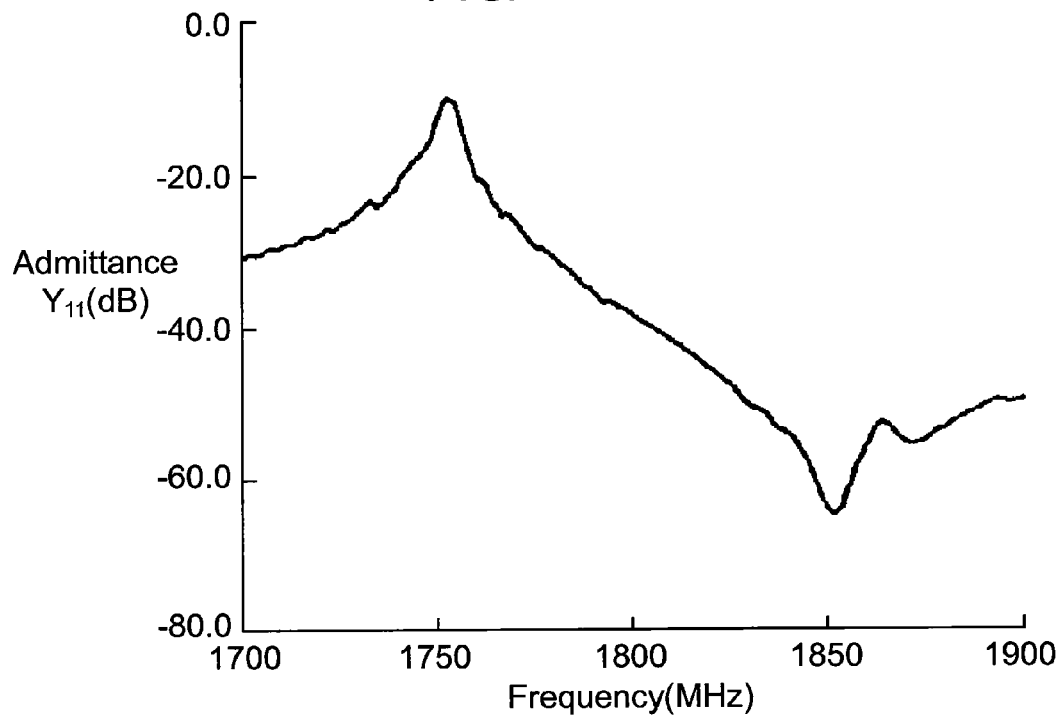
FIG. 2 is a graph showing an admittance characteristic of the acoustic wave resonance device.
Figure 3:
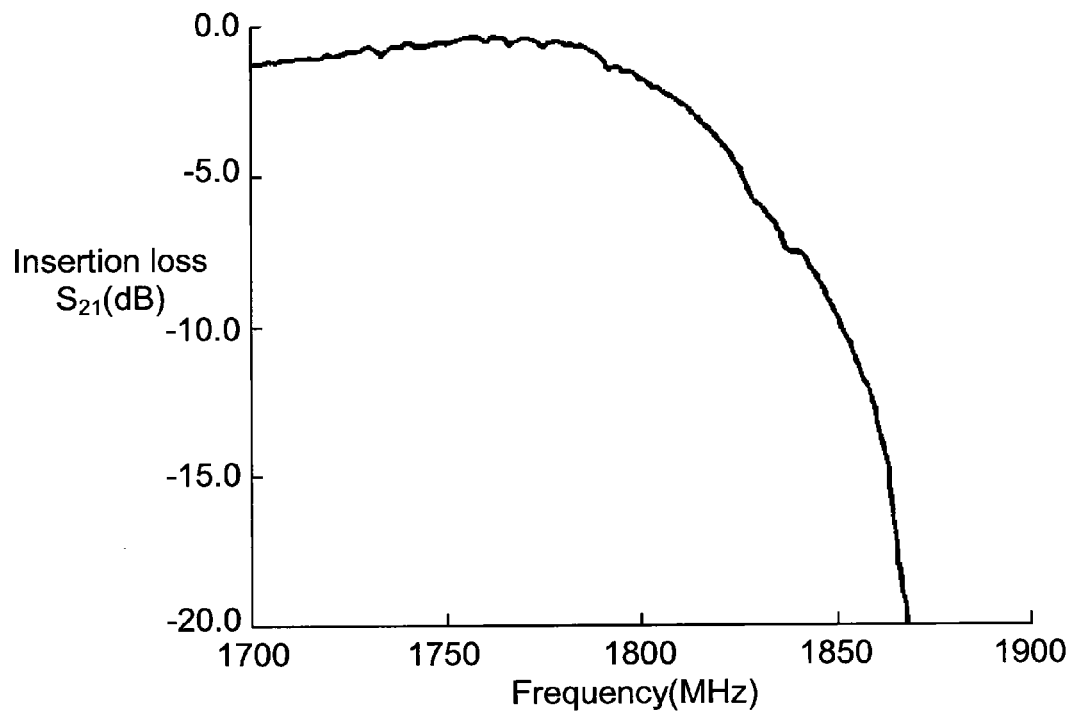
FIG. 3 is a graph showing a pass characteristic of the acoustic wave resonance device.
Figure 20:
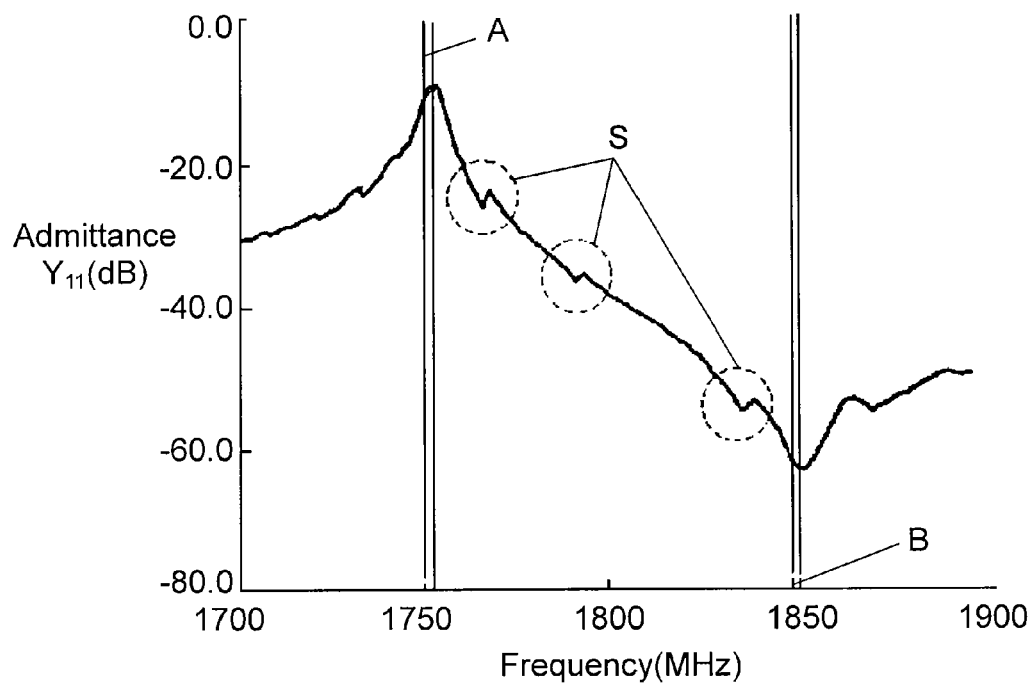
FIG. 20 is a graph showing an admittance characteristic of the acoustic wave resonance device.
Figure 21:
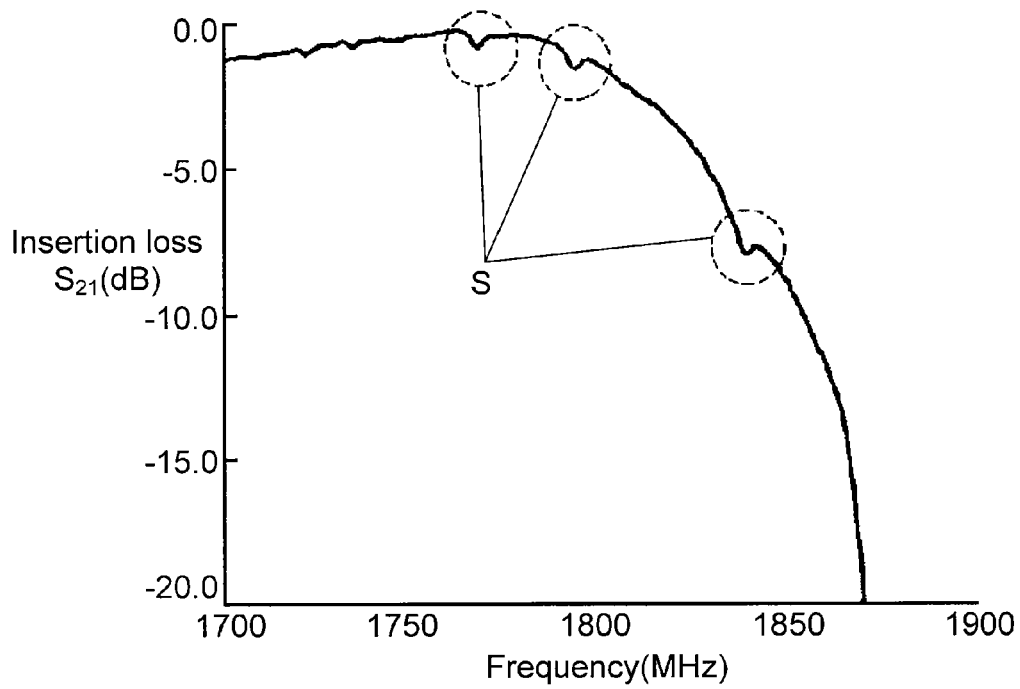
FIG. 21 is a graph showing a pass characteristic of the acoustic wave resonance device.
Figure 22:
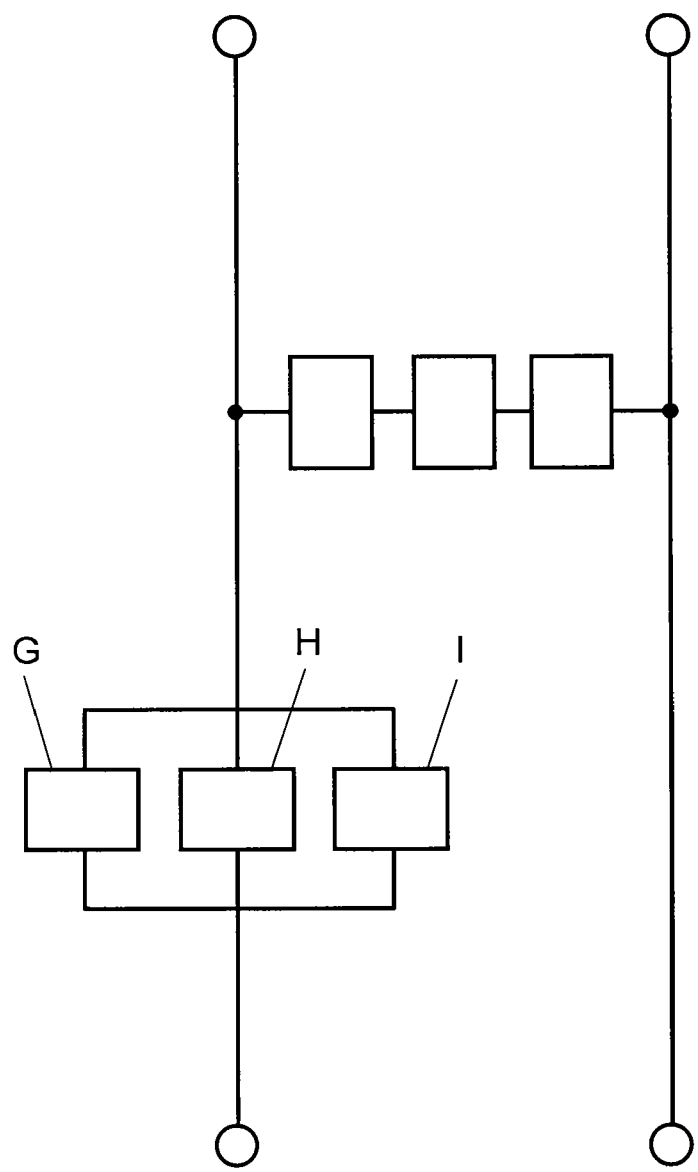
FIG. 22 is a diagram showing a configuration of another conventional acoustic wave resonance device.

This state is described with reference to FIGS. 2 and 3. FIG. 2 is a graph showing an admittance characteristic of the acoustic wave resonance device in this exemplary embodiment. FIG. 3 is a graph showing a pass characteristic of the acoustic wave resonance device in this exemplary embodiment. The admittance characteristic with respect to frequency in the configuration of this exemplary embodiment shown in FIG. 2 is compared with that in a conventional configuration shown in FIG. 20. The comparison result shows that according to this exemplary embodiment, transverse mode spurious responses S observed between resonance frequency A and anti-resonant frequency B are distributed, and an absolute value of admittance Y11 per transverse mode spurious response S is reduced. In addition, the pass characteristic in the configuration of this exemplary embodiment shown in FIG. 3 is compared with that in a conventional configuration shown in FIG. 21. The comparison result shows that according to this exemplary embodiment, transverse mode spurious responses S are distributed, and an absolute value of insertion loss S21 per transverse mode spurious response S is reduced. From the above reasons, according to this exemplary embodiment, loss of the acoustic wave resonance device and the acoustic wave resonance device can be reduced.

Furthermore, it is desirable that number of pairs N1 in first acoustic wave resonator 100 and number of pairs N2 in second acoustic wave resonator 200 shown in FIG. 1 satisfy the condition: N1<N2. That is to say, it is preferable that number of pairs N1 that is a number of pairs consisting of comb-shaped electrode 112 and comb-shaped electrode 113 which form first acoustic wave resonator 100 is smaller than number of pairs N2 that is a number of pairs consisting of comb-shaped electrode 212 and comb-shaped electrode 213 which form second acoustic wave resonator 200. Capacitance C1 of first acoustic wave resonator 100 is in proportion to the product of number of pairs N1 and overlap width L1. Similarly, capacitance C2 of second acoustic wave resonator 200 is in proportion to the product of number of pairs N2 and overlap width L2. Therefore, when number of pairs N1 in first acoustic wave resonator 100 is the same as number of pairs N2 in second acoustic wave resonator 200, the relation: capacitance C1>capacitance C2 is satisfied from the relation: overlap width L1>overlap width L2. In general, a voltage applied to second acoustic wave resonator 200 is in reverse proportion to the capacitance ratio C2/C1 of first acoustic wave resonator 100 to second acoustic wave resonator 200. Therefore, when capacitance C1 is larger than capacitance C2, a voltage applied to second acoustic wave resonator 200 is higher than a voltage applied to first acoustic wave resonator 100, and thus power durability is deteriorated. Therefore, when the relation: number of pairs N1<number of pairs N2 is satisfied, the ratio of capacitance C1 to capacitance C2 is relaxed and a voltage applied to each comb-shaped electrode 213 of interdigital transducer electrode 210 forming second acoustic wave resonator 200 is reduced. Thus, the power durability can be improved.

Furthermore, it is desirable that the condition: capacitance C1>capacitance C2 is satisfied. Even when the acoustic wave resonator has the same capacitance, an acoustic wave resonator having a longer overlap width and a smaller number of pairs is deteriorated in power durability due to heating by resistance loss of the comb-shaped electrodes as compared with an acoustic wave resonator having a shorter overlap width and a larger number of pairs. Therefore, in the condition setting of number of pairs N1 and N2, by making capacitance C1 be larger than capacitance C2, a voltage applied to each resonance device can be controlled, and thus the power durability can be improved.

By allowing pitch P1 of first acoustic wave resonator 100 and pitch P2 of second acoustic wave resonator 200 to be equal to each other and allowing the resonance frequencies of the acoustic wave resonators to coincide with each other, loss can be minimized. On the contrary, by allowing pitch P1 and pitch P2 to be different from each other, the bandwidths of the pass band and the attenuation band can be widened. Thus, the degree of freedom in designing can be increased.

This exemplary embodiment describes an acoustic wave resonance device in which first and second acoustic wave resonators 100 and 200 are cascade-connected in two stages. However, this exemplary embodiment can be applied to an acoustic wave resonance device in which acoustic wave resonators are cascade-connected in three stages or more.

When an acoustic wave filter is configured by using an acoustic wave resonance device in accordance with this exemplary embodiment, transverse mode spurious responses generated in the pass band can be suppressed effectively, and thus loss can be reduced.

It is desirable that a cut angle of a rotation-Y plate of piezoelectric substrate 1 shown in FIG. 1 is set to about −30° to +30°. When the cut angle is set to an angle in this range, a wide-band acoustic wave resonance device can be achieved.

When at least one of first and second interdigital transducer electrodes 110 and 210 is covered with a $SiO_2$ thin film (oxide film) having a thickness that is 15% or more of the wavelength of an acoustic wave, loss of the acoustic wave can be reduced, and the temperature property can be also improved. Therefore, it is possible to configure an acoustic wave resonance device which has excellent characteristics and in which loss is reduced in a wide pass band.

Figure 4:
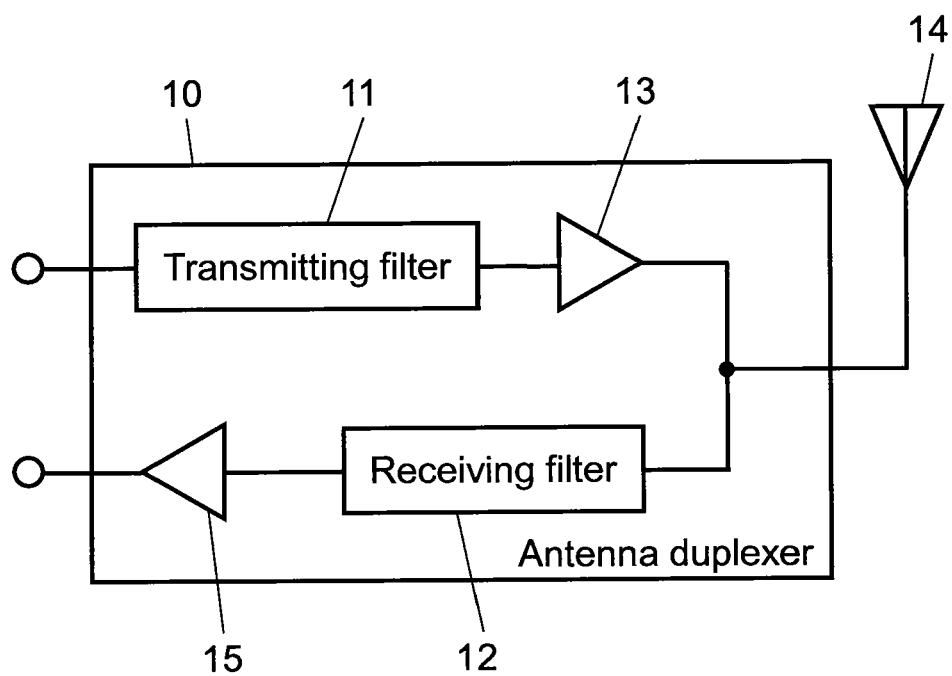
FIG. 4 is a diagram showing a configuration of an antenna duplexer using the acoustic wave resonance device.

FIG. 4 is a diagram showing a configuration of an antenna duplexer using an acoustic wave filter including the acoustic resonance device in this exemplary embodiment. In FIG. 4, antenna duplexer 10 includes transmitting filter 11 and receiving filter 12. At least one of transmitting filter 11 and receiving filter 12 is an acoustic wave filter configured by the acoustic wave resonance device of this exemplary embodiment. Transmitting filter 11 is connected to antenna element 14 via amplifier 13. Receiving filter 12 is connected to between antenna element 14 and amplifier 15.

Antenna duplexer 10 transmits a signal in a predetermined bandwidth, which is determined by transmitting filter 11 among transmitted signals, from antenna element 14 via amplifier 13. Furthermore, antenna duplexer 10 receives a signal in a predetermined band determined by receiving filter 12 among the received signals entering into antenna element 14 and takes it into the inside via amplifier 15.

Antenna duplexer 10 having such a configuration can suppress spurious responses effectively as mentioned above, and therefore loss can be reduced.

The suppression of transverse mode spurious responses by the technique in this exemplary embodiment is particularly effective when piezoelectric substrate 1 having such a large coupling coefficient that a plurality of transverse mode spurious responses S is generated between resonance frequency A and anti-resonant frequency B. For example, it is particularly effective when piezoelectric substrate 1 made of lithium niobate-based compounds or potassium niobate-based compounds is used. This is because when frequency interval is narrow such that a single transverse mode spurious response S is generated between resonance frequency A and anti-resonant frequency B, the transverse mode spurious response can be suppressed easily by shifting the transverse mode spurious response to the outside of between the resonance frequency A and anti-resonant frequency B.

Second Exemplary Embodiment

A second exemplary embodiment is different from the first exemplary embodiment in that interdigital transducer electrode 110 and interdigital transducer electrode 210 are connected in parallel.

Figure 5:
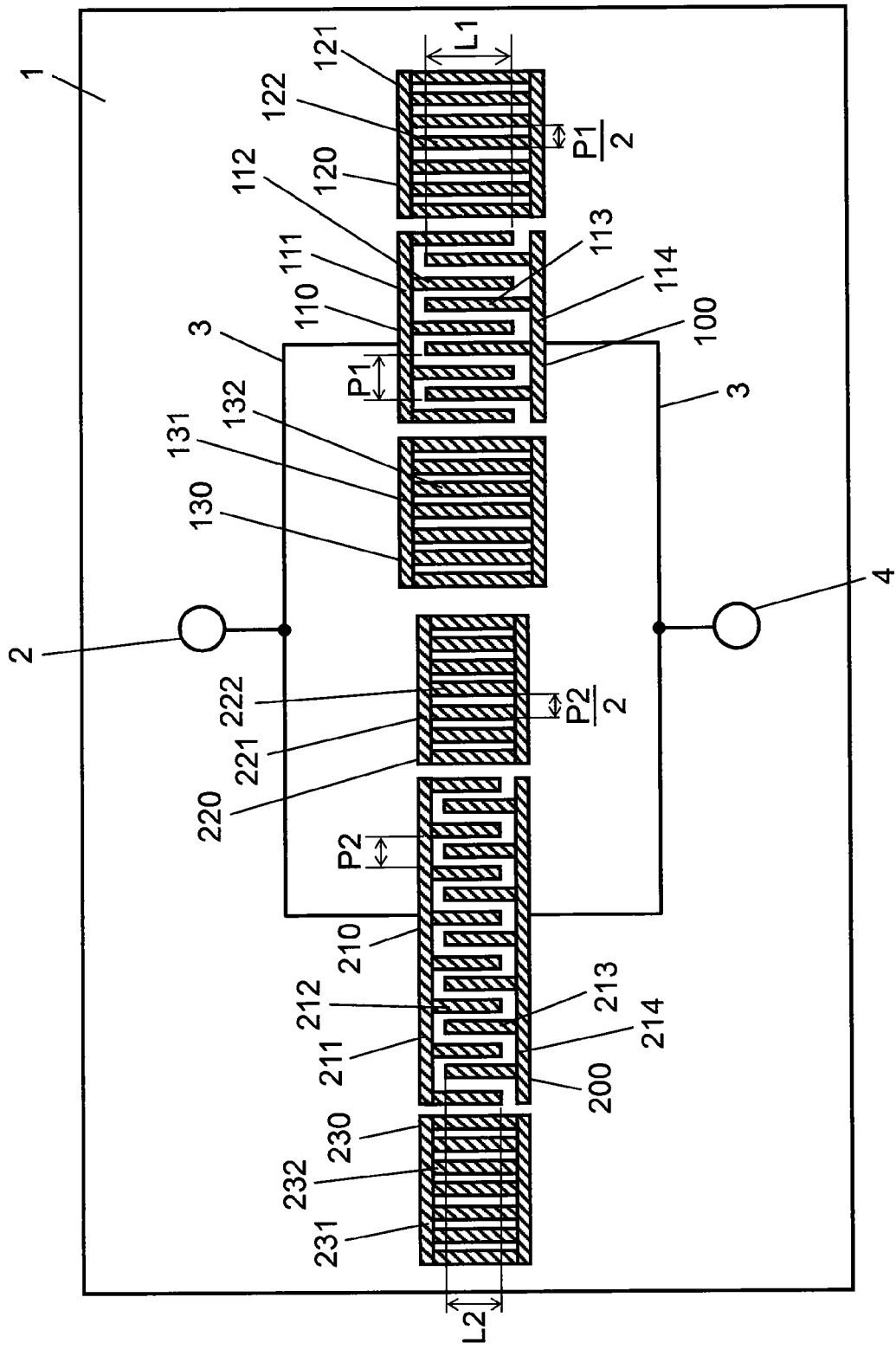
FIG. 5 is a top view showing an acoustic wave resonance device in accordance with a second exemplary embodiment of the present invention.

FIG. 5 is a top view showing an acoustic wave resonance device in accordance with the second exemplary embodiment of the present invention. The acoustic wave resonance device shown in this exemplary embodiment includes piezoelectric substrate 1 made of lithium niobate, and first acoustic wave resonator 100 and second acoustic wave resonator 200 provided on an upper surface of piezoelectric substrate 1 as shown in FIG. 5. First acoustic wave resonator 100 and second acoustic wave resonator 200 are connected in parallel.

First acoustic wave resonator 100 includes interdigital transducer electrode 110 and grating reflectors 120 and 130. Grating reflectors 120 and 130 are disposed such that they sandwich interdigital transducer electrode 110 therebetween on an acoustic wave propagation path.

Interdigital transducer electrode 110 includes bus bar 111 and a plurality of comb-shaped electrodes 112 that have the same length and are electrically connected to each other to bus bar 111. The comb-shaped electrodes 112 are provided on bus bar 111 at an interval of P1. Furthermore, interdigital transducer electrode 110 includes bus bar 114 and a plurality of comb-shaped electrodes 113 that have the same length and are electrically connected to each other to bus bar 114. Comb-shaped electrodes 113 are provided on bus bar 114 at an interval of P1.

Comb-shaped electrode 112 and comb-shaped electrode 113 are overlapped with an overlap width of L1. Bus bar 111 is electrically connected to input terminal 2. Bus bar 114 is electrically connected to output terminal 4.

Grating reflector 120 includes a plurality of comb-shaped electrodes 122 electrically connected to bus bar 121. Comb-shaped electrodes 122 are provided on bus bar 121 at an interval of P1/2. Grating reflector 130 includes a plurality of comb-shaped electrodes 132 electrically connected to bus bar 131. Comb-shaped electrodes 132 are provided on bus bar 131 at an interval of P1/2.

Similarly, second acoustic wave resonator 200 includes interdigital transducer electrode 210 and grating reflectors 220 and 230. Grating reflectors 220 and 230 are disposed such that they sandwich interdigital transducer electrode 210 therebetween on an acoustic wave propagation path.

Interdigital transducer electrode 210 includes bus bar 211 and a plurality of comb-shaped electrodes 212 electrically connected to bus bar 211. The comb-shaped electrodes 212 are provided on bus bar 211 at an interval of P2. Furthermore, interdigital transducer electrode 210 includes bus bar 214 and a plurality of comb-shaped electrodes 213 that have the same length and are electrically connected to each other to bus bar 214. Comb-shaped electrodes 213 are provided on bus bar 214 at an interval of P2.

Comb-shaped electrode 212 and comb-shaped electrode 213 are overlapped with an overlap width of L2. Overlap width L2 of comb-shaped electrodes 212 and 213 is smaller than overlap width L1 of first acoustic wave resonator 100. Bus bar 211 is electrically connected input terminal 2 and bus bar 214 is electrically connected to output terminal 4 by connection line 3, respectively. Thus, first acoustic wave resonator 100 and second acoustic wave resonator 200 are connected in parallel.

Grating reflector 220 includes a plurality of comb-shaped electrodes 222 electrically connected to bus bar 221. Comb-shaped electrodes 222 are provided on bus bar 221 at an interval of P2/2. Grating reflector 230 includes a plurality of comb-shaped electrodes 232 electrically connected to bus bar 231. Comb-shaped electrodes 232 are provided on bus bar 231 at an interval of P2/2.

In this way, by allowing overlap width L1 of comb-shaped electrodes 112 and 113 forming first acoustic wave resonator 100 to be different from overlap width L2 of comb-shaped electrodes 212 and 213 forming second acoustic wave resonator 200, the below-mentioned effects can be obtained.

Figure 6:
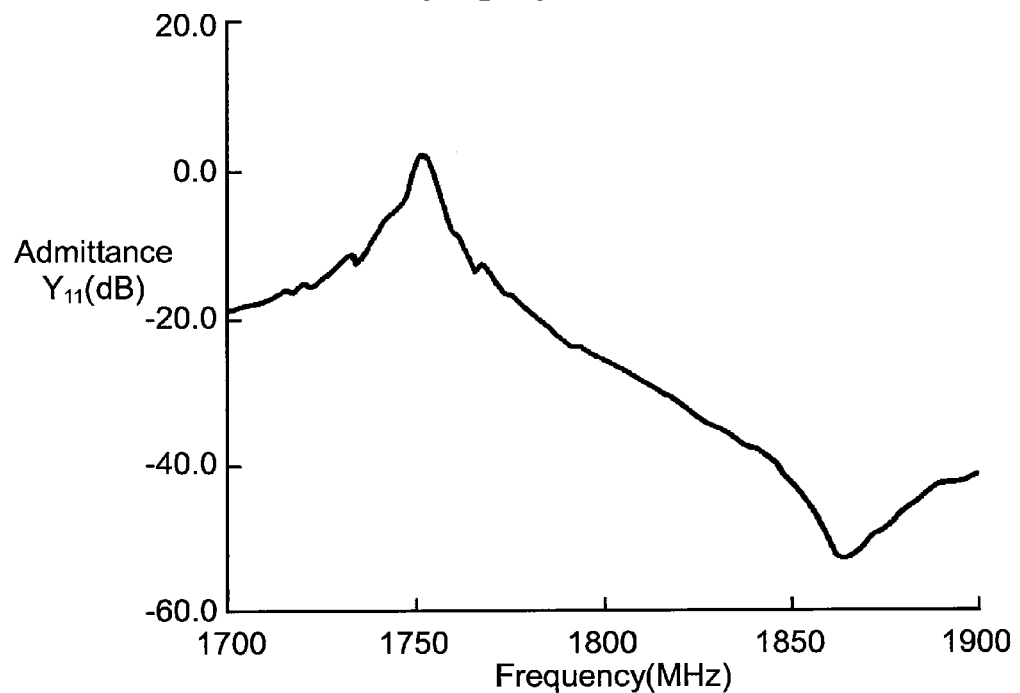
FIG. 6 is a graph showing an admittance characteristic of the acoustic wave resonance device.
Figure 7:
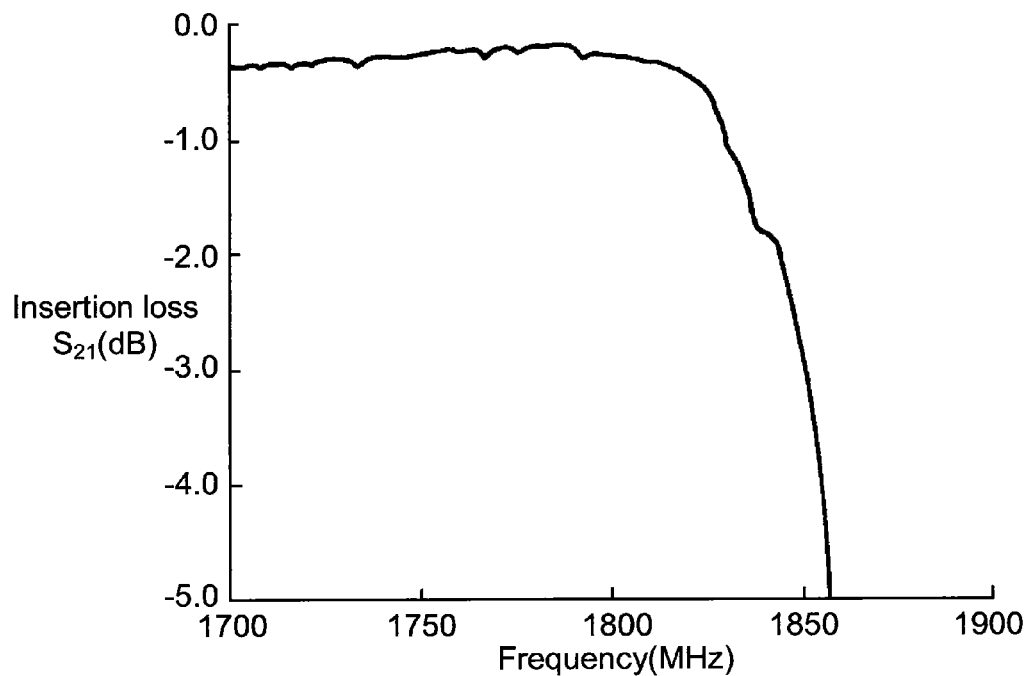
FIG. 7 is a graph showing a pass characteristic of the acoustic wave resonance device.
Figure 23:
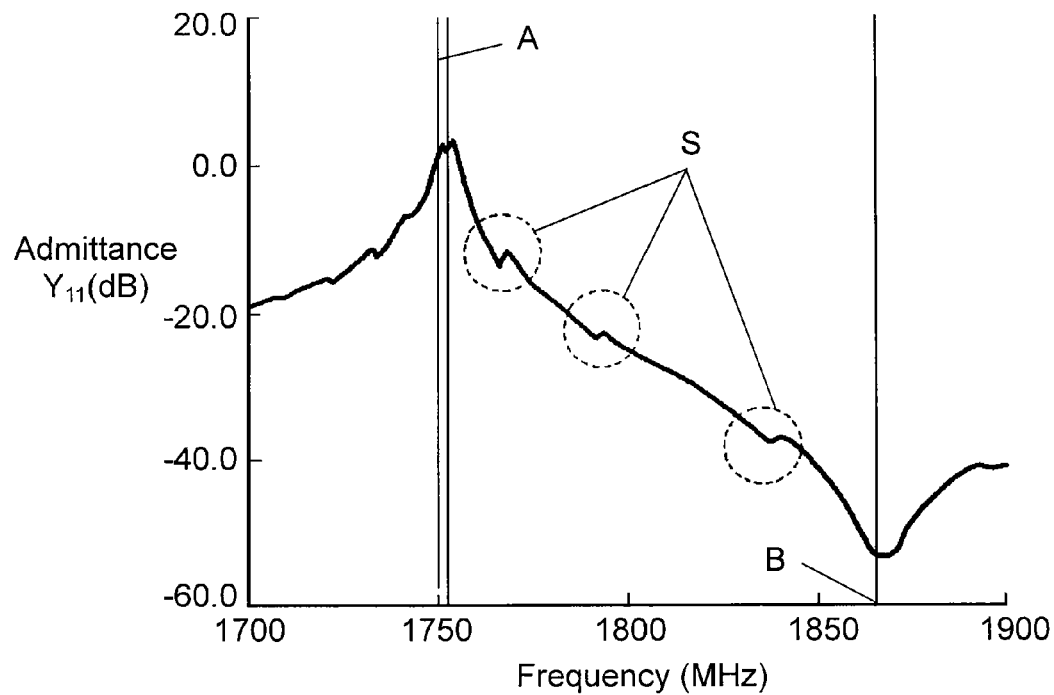
FIG. 23 is a graph showing an admittance characteristic of the acoustic wave resonance device.
Figure 24:
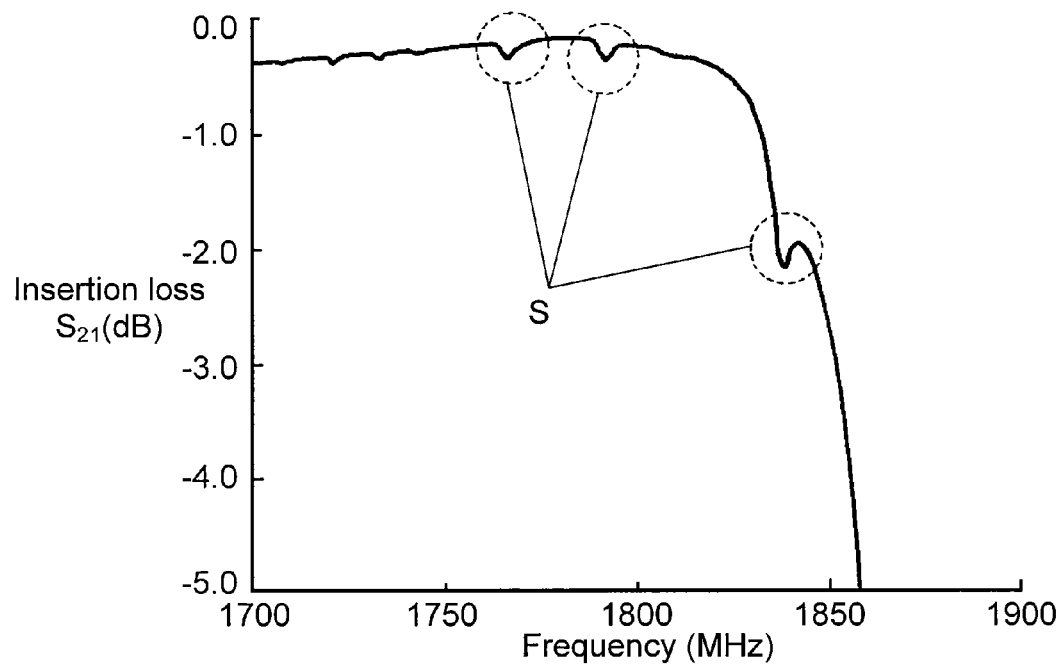
FIG. 24 is a graph showing a pass characteristic of the acoustic wave resonance device.

In this exemplary embodiment, as in the first exemplary embodiment, overlap width L1 is allowed to be different from overlap width L2. Thus, the transverse mode spurious responses can be distributed such that frequencies in which a transverse mode spurious response is generated is allowed to be different frequency bands between first and second acoustic wave resonators 100 and 200. This state is described with reference to FIGS. 6 and 7. FIG. 6 is a graph showing an admittance characteristic of the acoustic wave resonance device in accordance with this exemplary embodiment. FIG. 7 is a graph showing a pass characteristic of the acoustic wave resonance device in accordance with this exemplary embodiment. The admittance characteristic with respect to frequency in the configuration in this exemplary embodiment shown in FIG. 6 is compared with that in a conventional configuration shown in FIG. 23. The comparison result shows that according to this exemplary embodiment, transverse mode spurious responses S observed between resonance frequency A and anti-resonant frequency B are distributed, and an absolute value per transverse mode spurious response S is reduced. In addition, the pass characteristic in this exemplary embodiment shown in FIG. 7 is compared with that in a conventional configuration shown in FIG. 24. The comparison result shows that according to this exemplary embodiment, transverse mode spurious responses S are distributed and an absolute value per transverse mode spurious response S is reduced as compared with FIG. 24. From the above reasons, the acoustic wave resonator of this exemplary embodiment can reduce loss.

Herein, when the relation: overlap width L1>overlap width L2 is satisfied, capacitance C1 and C2 of first and second acoustic wave resonators 100 and 200 satisfy the relation: capacitance C1>capacitance C2. Then, it is desirable that the ratio of C1 and C2 is relaxed by allowing the numbers of pairs N1 and N2 in first and second acoustic wave resonators 100 and 200 to satisfy the relation: number of pairs N2>number of pairs N1.

Furthermore, the configuration of this exemplary embodiment is effective in suppressing transverse mode spurious responses S not only in a configuration of an acoustic wave resonator in which one interdigital transducer electrode is sandwiched by two grating reflectors but also in a configuration in which two or more interdigital transducer electrodes are disposed on the propagation path.

By allowing pitch P1 of first acoustic wave resonator 100 and pitch P2 of second acoustic wave resonator 200 to be equal to each other and the resonance frequencies of first and second acoustic wave resonators 100 and 200 to coincide with each other, loss can be minimized. On the contrary, by allowing pitch P1 and pitch P2 to be different from each other, the bandwidths of the pass band and the attenuation band can be widened, and the degree of freedom in designing can be increased.

This exemplary embodiment describes a configuration in which first and second acoustic wave resonators 100 and 200 are connected in parallel. However, three or more acoustic wave resonators can be connected in parallel.

When the acoustic wave resonance device is configured by using the acoustic wave resonator of this exemplary embodiment, it is possible to effectively suppress transverse mode spurious responses S generated in the pass band.

It is desirable that a cut angle of a rotation-Y plate of piezoelectric substrate 1 shown in FIG. 5 is set to about −30° to +30°. When the cut angle is set to an angle in this range, a wide-band acoustic wave resonance device can be achieved.

When at least one of first and second interdigital transducer electrodes 110 and 210 is covered with a $SiO_2$ thin film having a thickness that is 15% or more of the wavelength of the acoustic wave, loss of the acoustic wave can be reduced and the temperature property can be improved. Therefore, it is desirable that an acoustic wave resonance device which has an excellent temperature property and in which loss is reduced in a wide band is configured.

Note here that by configuring a transmitting filter and a receiving filter by using the configuration of this exemplary embodiment, a low-loss acoustic wave antenna duplexer can be configured.

The suppression of transverse mode spurious responses by the technique in this exemplary embodiment is particularly effective when piezoelectric substrate 1 having such a large coupling coefficient that a plurality of transverse mode spurious responses S is generated between resonance frequency A and anti-resonant frequency B. For example, it is particularly effective when piezoelectric substrate 1 made of lithium niobate-based compounds or potassium niobate-based compounds is used. This is because when frequency interval is narrow such that a single transverse mode spurious response S is generated between resonance frequency A and anti-resonant frequency B, the transverse mode spurious responses can be suppressed easily by shifting the transverse mode spurious response to the outside of between the resonance frequency A and anti-resonant frequency B.

Third Exemplary Embodiment

An acoustic wave filter in accordance with a third exemplary embodiment of the present invention is described with reference to drawings. In the third exemplary embodiment, a plurality of interdigital transducer electrodes is disposed between two grating reflectors.

Figure 8:
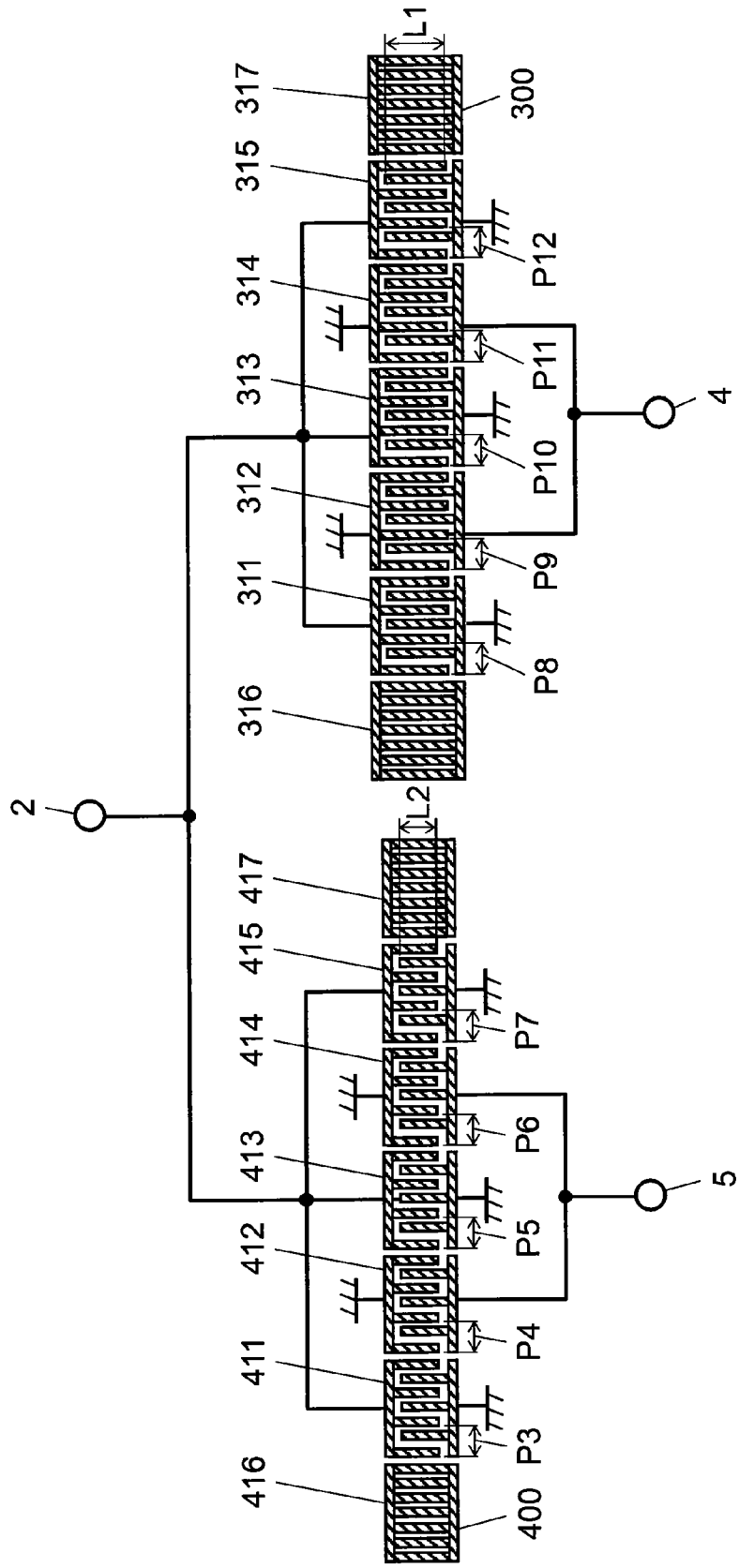
FIG. 8 is a top view showing an acoustic wave resonance device in accordance with a third exemplary embodiment of the present invention.

FIG. 8 is a top view showing an acoustic wave filter in accordance with the third exemplary embodiment of the present invention. In FIG. 8, first acoustic wave resonator 300 includes interdigital transducer electrodes 311, 312, 313, 314, and 315 having an overlap width of L1 and grating reflectors 316 and 317 on the upper surface of a piezoelectric substrate. Interdigital transducer electrodes 311, 312, 313, 314, and 315 are disposed on the acoustic wave propagation path with an overlap width of L1 (overlap width L1 of comb-shaped electrodes of first acoustic wave resonator 300). The comb-shaped electrodes of interdigital transducer electrodes 311, 312, 313, 314, and 315 are disposed at pitches of P8, P9, P10, P11, and P12, respectively. Grating reflectors 316 and 317 are disposed such that they sandwich interdigital transducer electrodes 311, 312, 313, 314, and 315 therebetween. Interdigital transducer electrodes 311, 313, and 315 are electrically connected to each other to input terminal 2. Interdigital transducer electrodes 312 and 314 are electrically connected to each other to output terminal 4.

Second acoustic wave resonator 400 includes interdigital transducer electrodes 411, 412, 413, 414, and 415 and grating reflectors 416 and 417 on the upper surface of the piezoelectric substrate. Interdigital transducer electrodes 411, 412, 413, 414, and 415 are disposed on the acoustic wave propagation path with an overlap width of L2 (overlap width L2 of the comb-shaped electrodes of second acoustic wave resonator 400). The comb-shaped electrodes of interdigital transducer electrodes 411, 412, 413, 414, and 415 are disposed at pitches of P3, P4, P5, P6, and P7, respectively. Grating reflectors 416 and 417 are disposed such that they sandwich interdigital transducer electrodes 411, 412, 413, 414, and 415 therebetween. Interdigital transducer electrodes 411, 413, and 415 are electrically connected to each other to input terminal 2. Interdigital transducer electrodes 412 and 414 are electrically connected to each other to output terminal 5. Herein, overlap width L2 of interdigital transducer electrodes 411, 412, 413, 414, and 415 (second acoustic wave resonator 400) is smaller than overlap width L1 of interdigital transducer electrodes 311, 312, 313, 314, and 315 (first acoustic wave resonator 300).

Figure 9:
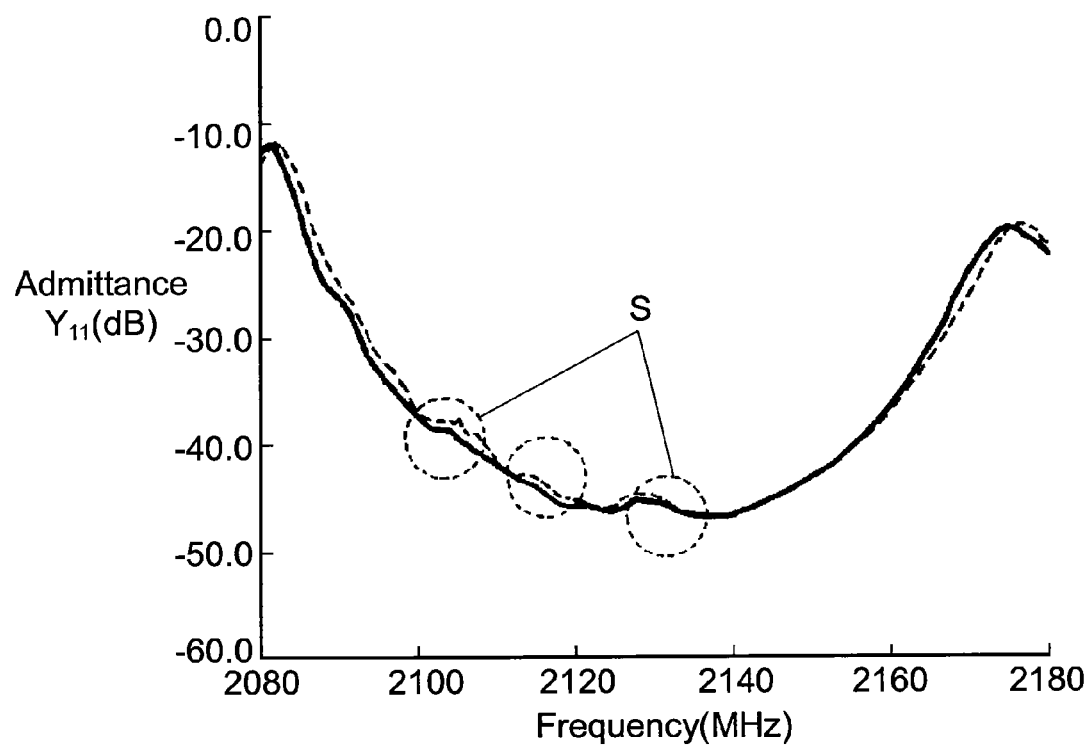
FIG. 9 is a graph showing an admittance characteristic of the acoustic wave resonance device.

With such a configuration, as shown in FIG. 9, transverse mode spurious responses S can be distributed and an absolute value per spurious response can be reduced. In FIG. 9, a dotted line shows a conventional admittance characteristic, and a solid line shows an admittance characteristic of this exemplary embodiment. From the comparison between the dotted line and the solid line, transverse mode spurious responses S shown in the solid line are reduced as compared with transverse mode spurious responses S shown in a dotted line.

The third exemplary embodiment describes acoustic wave resonators 300 and 400 each having five interdigital transducer electrodes. Even if the number of the interdigital transducer electrodes is not five, the effect of suppressing spurious responses can be also obtained.

Note here that by allowing all of the overlap widths of interdigital transducer electrodes 311, 312, 313, 314, and 315 of first acoustic wave resonator 300 to be equal to each other, an acoustic wave resonance filter having small loss can be configured. Furthermore, by allowing the pitches of the overlap widths of interdigital transducer electrodes 311, 312, 313, 314, and 315 to be different from each other, the degree of freedom in designing can be increased. The same is true to interdigital transducer electrodes 411, 412, 413, 414, and 415 of second acoustic wave resonator 400.

By allowing pitches P8, P9, P10, P11, and P12 of first acoustic wave resonator 300 and pitches P3, P4, P5, P6, and P7 of acoustic wave resonator 400 to be equal to each other (that is, by allowing all the pitches to be equal to each other) and allowing two resonance frequencies of acoustic wave resonators 300 and 400 to coincide with each other, loss can be minimized. On the contrary, by allowing at least one pair of pairs of pitches P8 and P3, pitches P9 and P4, pitches P10 and P5, pitches P11 and P6, and pitches P12 and P7 to be different from the other pairs of pitches, the degree of balance between first acoustic wave resonator 300 and second acoustic wave resonator 400 can be adjusted.

This exemplary embodiment describes a configuration in which two acoustic wave resonators 300 and 400 are connected in parallel. However, three or more acoustic wave resonators can be connected in parallel.

When an acoustic wave filter is configured by using an acoustic wave resonator in accordance with this exemplary embodiment, transverse mode spurious responses generated in the pass band can be suppressed effectively and loss can be reduced.

Note here that it is desirable that a cut angle of a rotation-Y plate of piezoelectric substrate 1 shown in FIG. 5 is set to about −30° to +30°. When the cut angle is set to an angle in this range, a wide-band acoustic wave filter can be achieved.

Note here that when at least one of the first interdigital transducer electrodes (311, 312, 313, 314, and 315) and second interdigital transducer electrodes (411, 412, 413, 414, and 415) are covered with a $SiO_2$ thin film having a thickness that is 15% or more of the wavelength of the acoustic wave, loss of the acoustic wave can be reduced. In addition, the temperature property can be improved. Therefore, it is possible to configure an acoustic wave filter which has an excellent temperature property and in which loss is reduced in a wide band.

Similar to the first and second exemplary embodiments, when a transmitting filter and a receiving filter are configured by using this exemplary embodiment, it is possible to configure a low-loss acoustic wave antenna duplexer with loss reduced.

The above-mentioned exemplary embodiments describe an example in which lithium niobate is used as a piezoelectric material. However, the present invention is not necessarily limited to this material, and a predetermined piezoelectric material such as lithium tantalite can be selected depending upon desired applications and properties of the acoustic wave resonance filter, and the like.

The suppression of transverse mode spurious responses by the technique in this exemplary embodiment is particularly effective when piezoelectric substrate 1 having such a large coupling coefficient that a plurality of transverse mode spurious responses S is generated between resonance frequency A and anti-resonant frequency B. For example, it is particularly effective when piezoelectric substrate 1 made of lithium niobate-based compounds or potassium niobate-based compounds is used. This is because when frequency interval is narrow such that a single transverse mode spurious response S is generated between resonance frequency A and anti-resonant frequency B, the transverse mode spurious responses can be suppressed easily by shifting the transverse mode spurious response to the outside of between the resonance frequency A and anti-resonant frequency B.

Fourth Exemplary Embodiment

Figure 10:
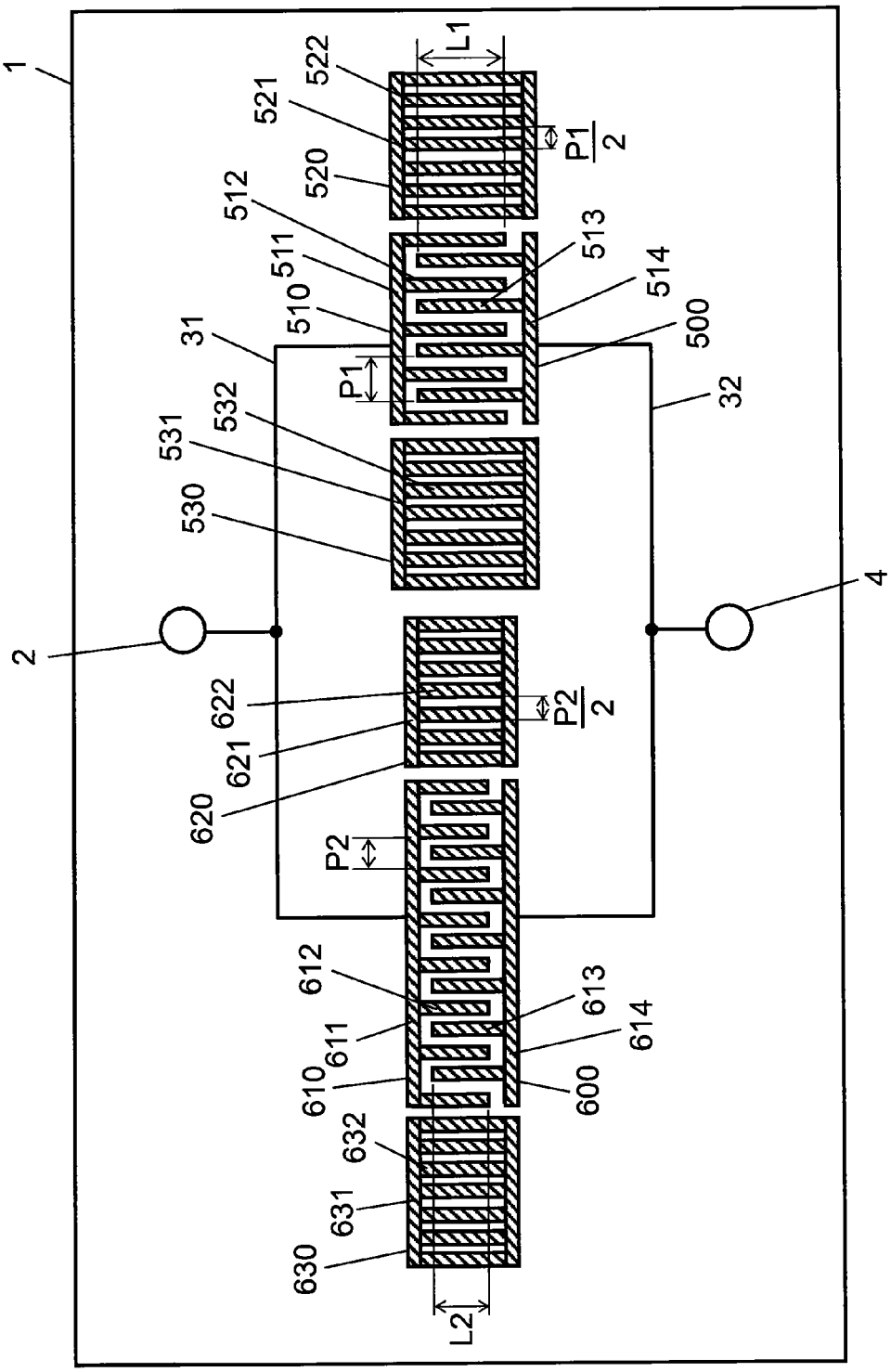
FIG. 10 is a top view showing an acoustic wave resonance device in accordance with a fourth exemplary embodiment of the present invention.

An acoustic wave resonance device shown in this exemplary embodiment includes piezoelectric substrate 1 made of lithium niobate, and first and second acoustic wave resonators 500 and 600 provided on piezoelectric substrate 1 as shown in FIG. 10. Acoustic wave resonator 500 and acoustic wave resonator 600 are electrically connected to each other in parallel.

First acoustic wave resonator 500 includes interdigital transducer electrode 510 and grating reflectors 520 and 530. Grating reflectors 520 and 530 are disposed such that they sandwich interdigital transducer electrode 510 therebetween in the acoustic wave propagation direction.

Interdigital transducer electrode 510 includes bus bar 511, a plurality of comb-shaped electrodes 512 electrically connected to bus bar 511, bus bar 514, a plurality of comb-shaped electrodes 513 electrically connected to bus bar 514. Comb-shaped electrode 512 and comb-shaped electrode 513 are overlapped with an overlap width of L1. Bus bar 511 is electrically connected to input terminal 2 via connection line 31, and bus bar 514 is electrically connected to output terminal 4 via connection line 32.

Grating reflector 520 includes bus bar 521 and comb-shaped electrodes 522 that are provided at an interval of P1/2 and electrically connected to bus bar 521. Grating reflector 530 includes bus bar 531 and comb-shaped electrodes 532 that are provided at an interval of P1/2 and electrically connected to bus bar 531.

Second acoustic wave resonator 600 includes interdigital transducer electrode 610 and grating reflectors 620 and 630. Grating reflectors 620 and 630 are disposed such that they sandwich interdigital transducer electrode 610 therebetween in the acoustic wave propagation direction.

Interdigital transducer electrode 610 includes bus bar 611, a plurality of comb-shaped electrodes 612 electrically connected to bus bar 611, bus bar 614, a plurality of comb-shaped electrodes 613 electrically connected to bus bar 614. Comb-shaped electrode 612 and comb-shaped electrode 613 are overlapped with an overlap width of L2. Overlap width L2 is smaller than overlap width L1 of first acoustic wave resonator 500. Bus bar 611 is electrically connected to input terminal 2 via connection line 31, and bus bar 614 is electrically connected to output terminal 4 via connection line 32.

Grating reflector 620 includes bus bar 621 and comb-shaped electrodes 622 that are provided at an interval of P2/2 and electrically connected to bus bar 621. Grating reflector 630 includes bus bar 631 and comb-shaped electrodes 632 that are provided at an interval of P2/2 and electrically connected to bus bar 631.

In this way, by allowing overlap width L1 of comb-shaped electrodes 512 and 513 forming acoustic wave resonator 500 to be different from overlap width L2 of comb-shaped electrodes 612 and 613 forming acoustic wave resonator 600, it is possible to achieve a low-loss acoustic wave resonance device that is less affected by a transverse mode spurious response. Hereinafter, the relation between the overlap width and the transverse mode spurious response is described.

The transverse mode spurious response is a spurious response generated in the pass band, which is caused by an occurrence of a standing wave in the direction perpendicular to the acoustic wave propagation direction. In particular, when lithium niobate is used for a piezoelectric substrate, the transverse mode spurious responses are generated remarkably, which is one of the causes to deteriorate the resonance performance of an acoustic wave resonator.

Herein, a conventional acoustic wave resonance device in which a plurality of acoustic wave resonators are connected in parallel or series has a problem that a larger spurious response occurs in the pass band as compared with a single acoustic wave resonator. As a result of analysis, it is shown that this problem occurs because the frequencies of the transverse mode spurious responses generated in acoustic wave resonators coincide with each other. That is to say, the transverse mode spurious responses generated in the acoustic wave resonators are strengthened by each other, resulting in generating a deep spurious response in the pass band.

In particular, when pitch P1 of acoustic wave resonator 500 and pitch P2 of acoustic wave resonator 600 are substantially the same as each other, the transverse mode spurious responses generated in acoustic wave resonators 500 and 600 are remarkably strengthened by each other. The term "pitch P1 of acoustic wave resonator 500 and pitch P2 of acoustic wave resonator 600 are substantially the same as each other" herein denotes that an absolute value of the difference between pitch P1 of acoustic wave resonator 500 and pitch P2 of acoustic wave resonator 600 is not more than any differences between pitch P1 of acoustic wave resonator 500 and pitches of any resonators other than acoustic wave resonator 600 in the acoustic wave resonance device.

Figure 11:
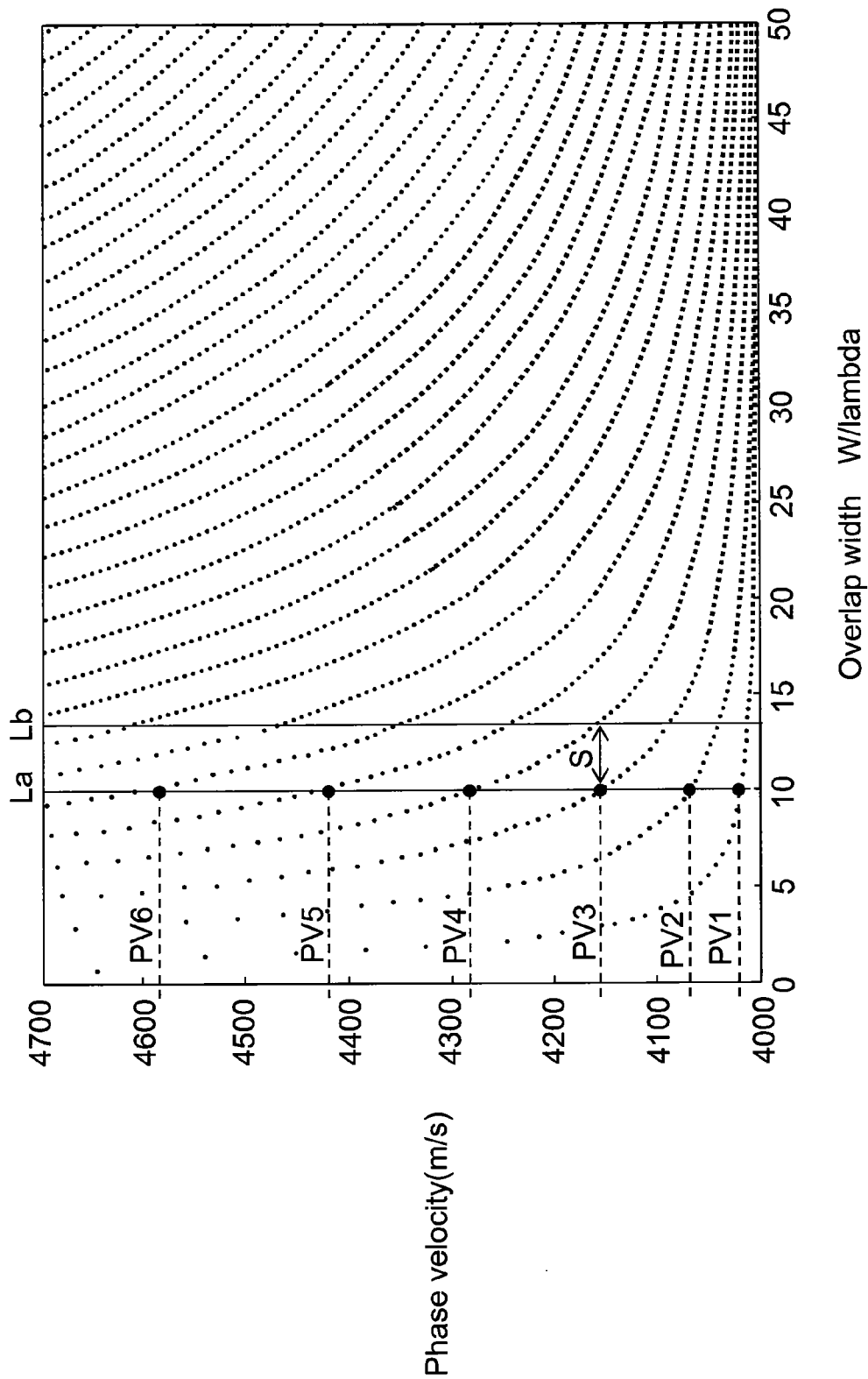
FIG. 11 is a graph showing overlap widths and frequencies in which the transverse mode spurious responses occur.

FIG. 11 shows a result of analysis of the relation between the overlap width and the cycle in which a transverse mode spurious response is generated. In FIG. 11, the abscissa shows the overlap width and the ordinate shows the phase velocity (=frequency×pitch of comb-shaped electrodes). For example, when the overlap width is La (=10 W/lambda), a transverse mode spurious response is generated in each of phase velocities PV1 to PV6 corresponding to each of the points shown by black circles. FIG. 11 shows that by adjusting the overlap width, it is possible to adjust the phase velocity at which a transverse mode spurious response is generated. That is to say, by adjusting the overlap width and the pitch of the comb-shaped electrodes, it is possible to adjust the frequency in which a transverse mode spurious response is generated.

In this exemplary embodiment, by using this relation, in acoustic wave resonators 500 and 600 having the same pitch, overlap width L1 of comb-shaped electrodes 512 and 513 forming acoustic wave resonator 500 is allowed to be different from overlap width L2 of comb-shaped electrodes 612 and 613 forming second acoustic wave resonator 600. With this configuration, frequencies in which a transverse mode spurious response is generated in acoustic wave resonators 500 and 600 can be distributed. Consequently, loss of the acoustic wave resonance device can be reduced.

By allowing pitch P1 of acoustic wave resonator 500 and pitch P2 of acoustic wave resonator 600 to be equal to each other and allowing the resonance frequencies of acoustic wave resonators 500 and 600 to coincide with each other, loss can be minimized. On the contrary, by allowing pitches P1 and P2 to be different from each other, the bandwidths of the pass band and the attenuation band can be widened. Thus, the degree of freedom in designing can be increased. In this case, overlap widths L1 and L2 may be designed by taking pitches P1 and P2 into account.

Herein, as shown in FIG. 11, even when overlap widths L1 and L2 are different from each other, transverse mode spurious responses may be generated in the same frequency. For example, when overlap width L1 of acoustic wave resonator 500 is La (10 W/lambda), and overlap width L2 of acoustic wave resonator 600 is Lb (about 13 W/lambda), transverse mode spurious responses are generated in a position corresponding to phase velocity PV3 in both acoustic wave resonators 500 and 600. As a result, the transverse mode spurious responses in this position are strengthened by each other, and loss in the pass band of the acoustic wave resonance device may be increased.

Therefore, in order to prevent transverse mode spurious responses generated in acoustic wave resonators 500 and 600 from overlapping, overlap widths L1 and L2 may be designed so as to satisfy the following mathematical formula Math. 1. In the mathematical formula, n represents an integer, and SC represents a cycle in which a transverse mode spurious response is generated in the same frequency with respect to the overlap width in acoustic wave resonator 500. That is to say, cycle SC represents an amount of change in which transverse mode spurious response is generated in the same frequency with respect to the overlap width in the first acoustic wave resonator.

$$L2 \neq L1 + nSC \qquad \text{[Math. 1]}$$

Furthermore, by designing overlap widths L1 and L2 so as to satisfy the following mathematical formula Math. 2, the transverse mode spurious responses can be distributed more effectively.

$$L2 = L1 + (n+\tfrac{1}{2})SC \qquad \text{[Math. 2]}$$

Note here that in the mathematical formula Math. 1 or 2, overlap width L2 may have a range of about 20% with respect to cycle SC. This is because cycle SC has a range of about 20% in the pass band of acoustic wave resonators 500 and 600 and therefore an effect of distributing transverse mode spurious responses is obtained in this range.

As mentioned above, when the overlap widths of the acoustic wave resonators provided in the acoustic wave resonance devices are designed so as to satisfy mathematical formula Math. 1 or 2, loss in the pass band in the acoustic wave resonance device can be reduced.

Figure 12:
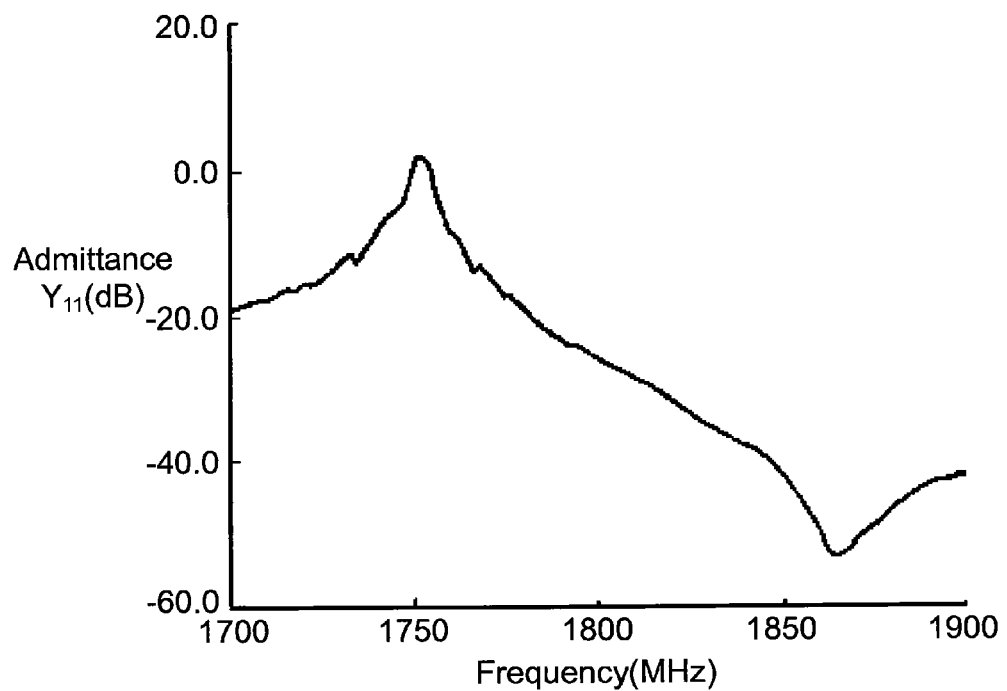
FIG. 12 is a graph showing an admittance characteristic of the acoustic wave resonance device.
Figure 13:
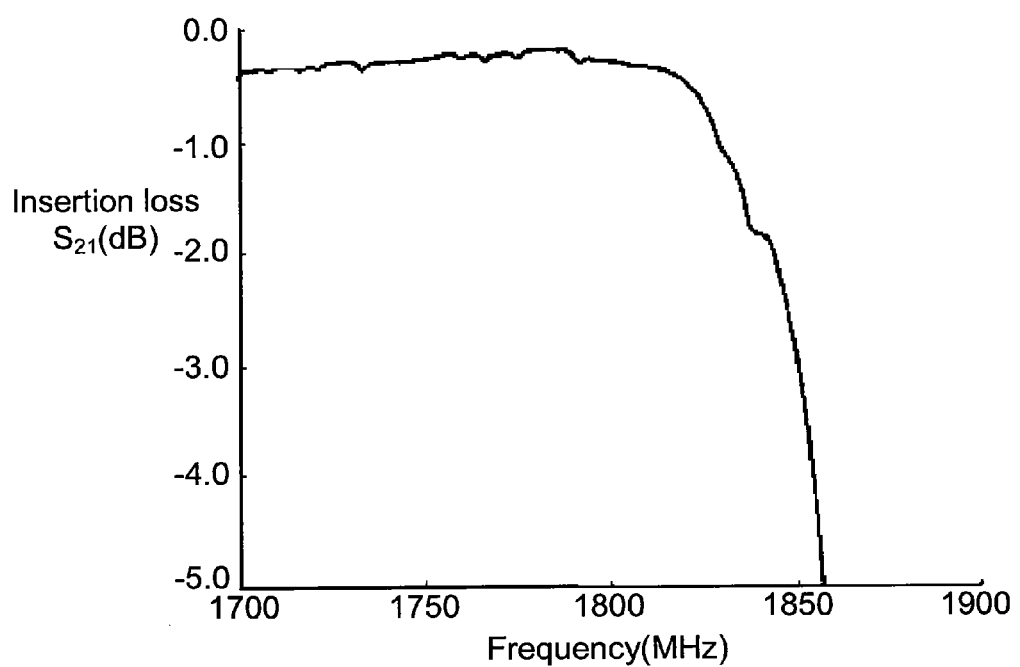
FIG. 13 is a graph showing a pass characteristic of the acoustic wave resonance device.

FIGS. 12 and 13 show characteristics of the acoustic wave resonance device in this exemplary embodiment. The admittance characteristic with respect to frequency in the configuration of this exemplary embodiment shown in FIG. 12 is compared with that in a conventional configuration shown in FIG. 20. The comparison result shows that according to the configuration in this exemplary embodiment, transverse mode spurious responses observed between resonance frequency A and anti-resonant frequency B are distributed, and an absolute value per transverse mode spurious response is reduced. In addition, the characteristic of the insertion loss with respect to the frequency in this exemplary embodiment shown in FIG. 13 is compared with that in a conventional configuration shown in FIG. 21. The comparison result shows that according to this exemplary embodiment, transverse mode spurious responses are distributed, and an absolute value per transverse mode spurious response is reduced.

When the relation: overlap width L1<overlap width L2 is satisfied, capacitance C1 and C2 of acoustic wave resonators 500 and 600 satisfy the relation: capacitance C1<capacitance C2. Thus, it is desirable that when number of pairs N1 and number of pairs N2 in acoustic wave resonators 500 and 600 satisfy the relation: number of pairs N2<number of pairs N1, the ratio of capacitance C1 to capacitance C2 is relaxed.

Note here that the present invention is effective in suppressing the transverse mode spurious response not only in acoustic wave resonator 500 (600) in this exemplary embodiment having a configuration in which one interdigital transducer electrode 510 (610) is sandwiched by two grating reflectors 520 and 530 (620 and 630) but also in a configuration in which two or more interdigital transducer electrodes are disposed on the propagation path.

This exemplary embodiment describes a configuration in which two acoustic wave resonators 500 and 600 are connected in parallel. However, three or more acoustic wave resonators can be connected in parallel.

Figure 14:
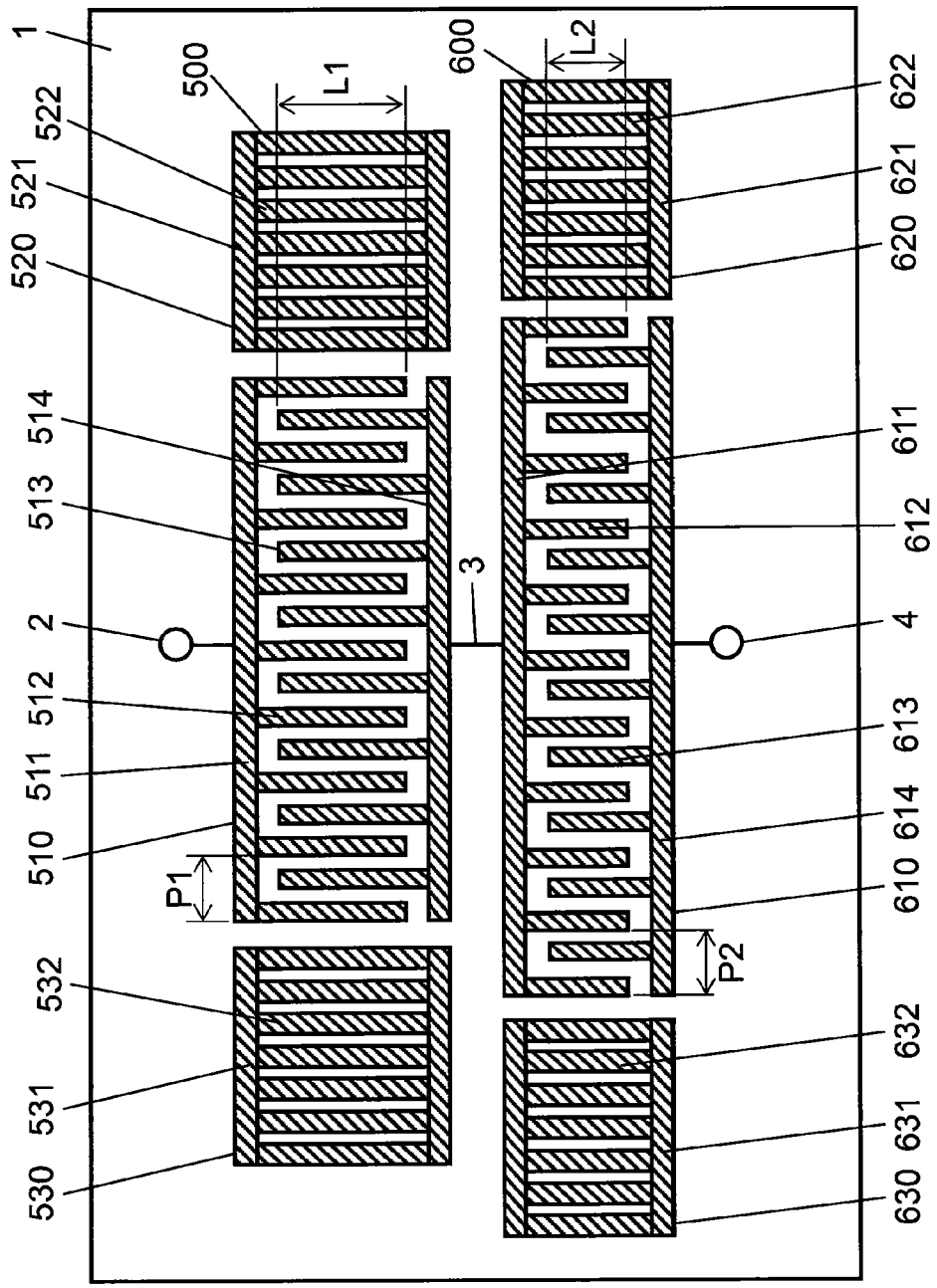
FIG. 14 is a top view showing another configuration of the acoustic wave resonance device.

This exemplary embodiment describes a configuration in which acoustic wave resonators 500 and 600 are connected in parallel. However, acoustic wave resonators 500 and 600 may be connected in series as shown in FIG. 14. Thus, a voltage applied to one acoustic wave resonator can be reduced, and the withstand voltage property can be improved. At the same time, when the overlap widths have the relation expressed by mathematical formula Math. 1 or 2, transverse mode spurious responses can be suppressed.

When an acoustic wave filter is configured by using the acoustic wave resonance device of the present invention, transverse mode spurious responses generated in the pass band can be effectively suppressed and loss can be reduced.

It is desirable that a cut angle of a rotation-Y plate of piezoelectric substrate 1 shown in FIG. 10 is set to about −30° to +30°. When the cut angle is set to an angle in this range, a wide-band acoustic wave filter can be achieved.

When at least one of first and second interdigital transducer electrodes 510 and 610 is covered with a SiO₂ thin film having a thickness that is 15% or more of the wavelength of the acoustic wave, loss of the acoustic wave can be reduced, and the temperature property can be also improved.

By configuring a transmitting filter and a receiving filter by using the configuration of this exemplary embodiment, a low-loss acoustic wave antenna duplexer can be configured.

Fifth Exemplary Embodiment

Figure 15:
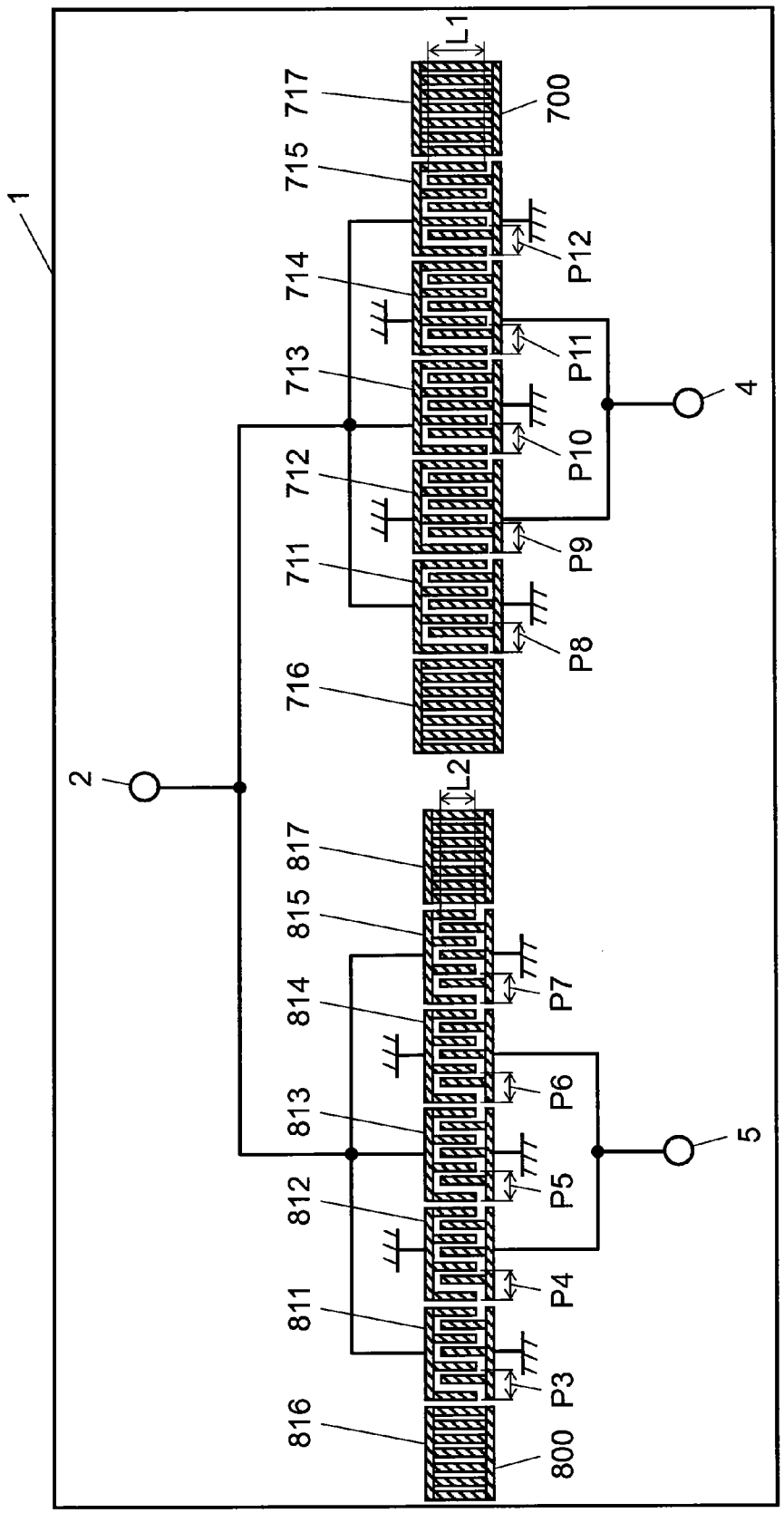
FIG. 15 is a top view showing an acoustic wave resonance device in accordance with a fifth exemplary embodiment of the present invention.

Hereinafter, features of a fifth exemplary embodiment are described. As shown in FIG. 15, first acoustic wave filter 700 is a DMS filter (double-mode SAW filter) including interdigital transducer electrodes 711, 712, 713, 714, and 715 and grating reflectors 716 and 717 on piezoelectric substrate 1. Furthermore, interdigital transducer electrodes 711, 712, 713, 714, and 715 are disposed on the acoustic wave propagation path. Grating reflectors 716 and 717 are disposed such that they sandwich interdigital transducer electrodes 711, 712, 713, 714, and 715 therebetween. An overlap width of interdigital transducer electrodes 711, 712, 713, 714, and 715 is L1. Interdigital transducer electrodes 711, 713, and 715 are electrically connected to each other to input terminal 2, and interdigital transducer electrodes 712 and 714 are electrically connected to each other to output terminal 4.

Second acoustic wave filter 800 is a DMS filter (double-mode SAW filter) including interdigital transducer electrodes 811, 812, 813, 814, and 815 and grating reflectors 816 and 817 on piezoelectric substrate 1. Furthermore, interdigital transducer electrodes 811, 812, 813, 814, and 815 are disposed on the acoustic wave propagation path. Grating reflectors 816 and 817 are disposed such that they sandwich interdigital transducer electrodes 811, 812, 813, 814, and 815 therebetween. An overlap width of interdigital transducer electrodes 811, 812, 813, 814, and 815 is L2. Interdigital transducer electrodes 811, 813, and 815 are electrically connected to each other to input terminal 2, and interdigital transducer electrodes 812 and 814 are electrically connected to each other to output terminal 5.

In particular, when pitches P8 to P12 of acoustic wave filter 700 and pitches P3 to P7 of acoustic wave filter 800 are substantially the same as each other, transverse mode spurious responses generated in the acoustic wave filters are remarkably strengthened by each other. The term "pitches P8 to P12 of acoustic wave filter 700 and pitches P3 to P7 of acoustic wave filter 800 are substantially the same as each other" herein denotes that an absolute value of the difference between pitches P8 to P12 of acoustic wave filter 700 and pitches P3 to P7 of acoustic wave filter 800 is not more than any differences between pitches P8 to P12 of acoustic wave filter 700 and pitches of any filters other than acoustic wave filter 800 in the acoustic wave resonance device.

Figure 16:
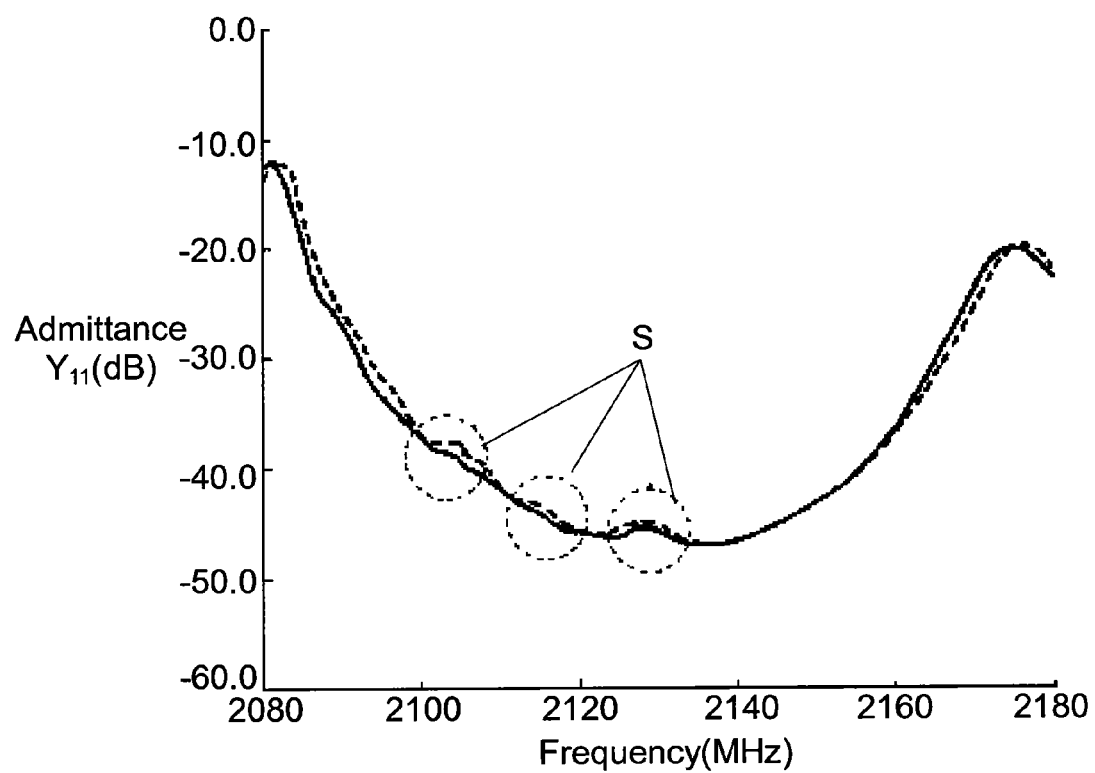
FIG. 16 is a graph showing an admittance characteristic of the acoustic wave resonance device.

Herein, overlap width L2 of second acoustic wave filter 800 is smaller than overlap width L1 of first acoustic wave filter 700. When overlap widths L1 and L2 have the relation expressed by mathematical formula Math. 1, transverse mode spurious responses S can be distributed as shown in a solid line in FIG. 16. Furthermore, when overlap widths L1 and L2 have the relation expressed by mathematical formula Math. 2, transverse mode spurious responses S can be distributed more effectively. As in FIG. 9, in FIG. 16, a dotted line shows a conventional admittance characteristic, and a solid line shows an admittance characteristic of this exemplary embodiment.

This exemplary embodiment describes acoustic wave filter 700 (800) having five interdigital transducer electrodes 711, 712, 713, 714, and 715 (811, 812, 813, 814, and 815). However, the number of the interdigital transducer electrodes is not necessarily limited to five, and also in such cases, the effect of suppressing spurious responses can be obtained.

Note here that by allowing all of overlap widths L1 of interdigital transducer electrodes 711, 712, 713, 714, and 715 of acoustic wave filter 700 to be equal to each other, a low-loss acoustic wave resonance device can be configured. Furthermore, by allowing the overlap widths L1 of interdigital transducer electrodes 711, 712, 713, 714, and 715 to be different from each other, transverse mode spurious responses can be further distributed. The same is true to overlap widths L2 of interdigital transducer electrodes 811, 812, 813, 814, and 815 of second acoustic wave filter 800.

By allowing pitches P8, P9, P10, P11, and P12 of acoustic wave filter 700 and pitches P3, P4, P5, P6, and P7 of acoustic wave filter 800 to be equal to each other, resonance frequencies of acoustic wave filters 700 and 800 can be allowed to coincide with each other. Thus, loss of the acoustic wave filter can be minimized. On the contrary, by allowing at least one pair of pairs of pitches P8 and P3, pitches P9 and P4, pitches P10 and P5, pitches P11 and P6, and pitches P12 and P7 to be different, the degree of balance between acoustic wave filter 700 and acoustic wave filter 800 can be adjusted.

This exemplary embodiment describes a configuration in which two acoustic wave filters 700 and 800 are connected in parallel. However, three or more acoustic wave filters can be connected in parallel.

When an acoustic wave filter is configured by using an acoustic wave filter of the present invention, transverse mode spurious responses generated in the pass band can be suppressed effectively and loss can be reduced.

Note here that it is desirable that a cut angle of a rotation-Y plate of piezoelectric substrate 1 shown in FIG. 15 is set to about −30° to +30°. When the cut angle is set to an angle in this range, a wide-band acoustic wave filter can be achieved.

Note here that when at least one of interdigital transducer electrodes 711, 712, 713, 714, and 715 of acoustic wave filter 700 and interdigital transducer electrodes 811, 812, 813, 814, and 815 of acoustic wave filter 800 are covered with a SiO2 thin film having a thickness that is 15% or more of the wavelength of the acoustic wave, loss of the acoustic wave can be reduced. At the same time, the temperature property can be improved.

By configuring a transmitting filter and a receiving filter by using the configuration of this exemplary embodiment, a low-loss acoustic wave antenna duplexer can be configured.

Sixth Exemplary Embodiment

Figure 17:
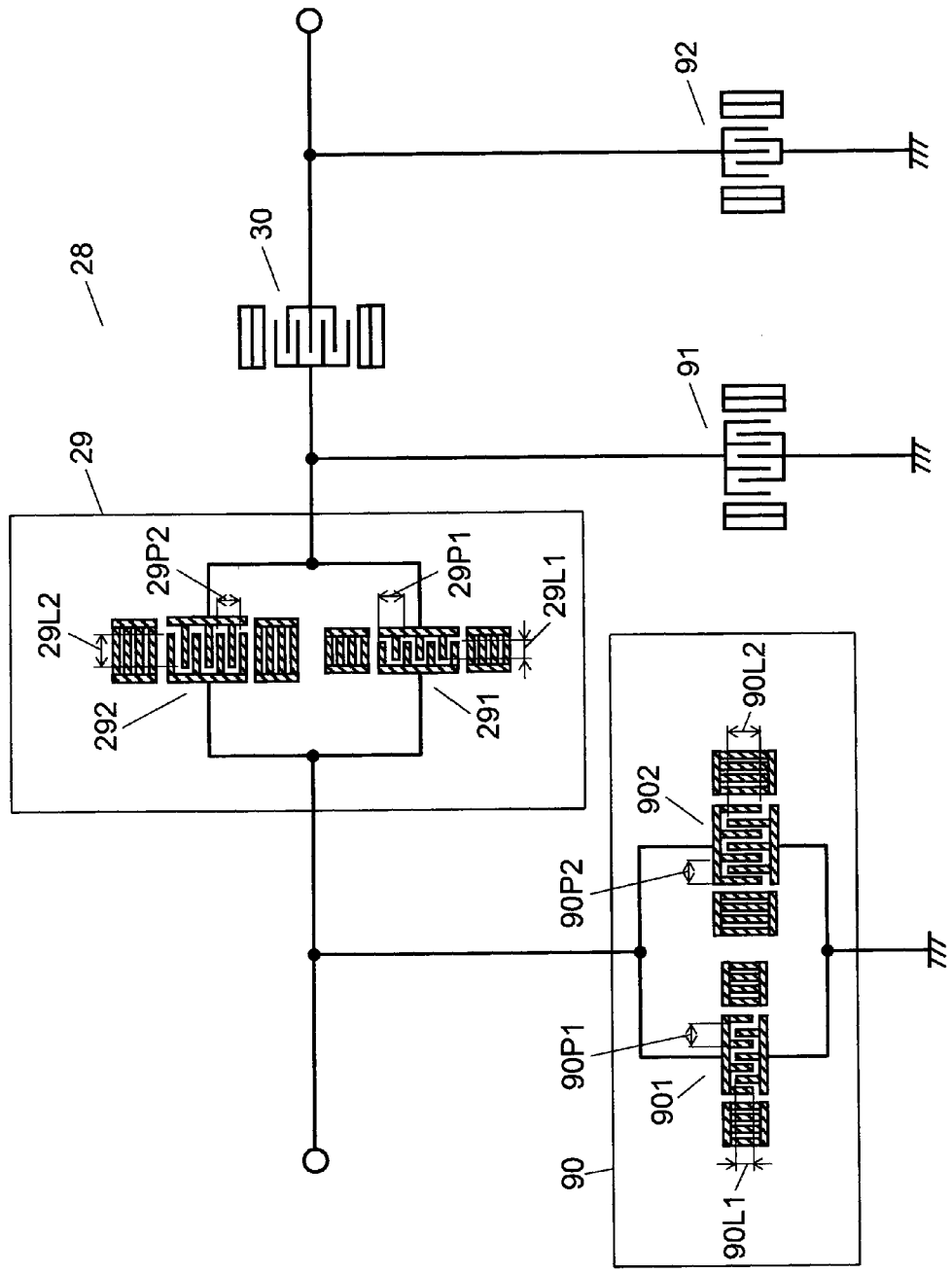
FIG. 17 is a top view showing an acoustic wave resonance device in accordance with a sixth exemplary embodiment of the present invention.

Hereinafter, features of the sixth exemplary embodiment are described. As shown in FIG. 17, ladder-type filter 28 includes series-arm acoustic wave resonance devices 29 and 30 and parallel-arm acoustic wave resonance devices 90, 91, and 92. Note here that FIG. 17 shows an example of a ladder-type filter. When three or more series-arm acoustic wave resonance devices are disposed and when two or four or more parallel-arm acoustic wave resonance devices are disposed, the effects described below can be obtained.

In ladder-type filter 28, by allowing the resonance frequencies of series-arm acoustic wave resonance devices 29 and 30 to be substantially equal to the anti-resonant frequencies of parallel-arm acoustic wave resonance devices 90, 91 and 92, the band pass characteristic can be obtained.

In acoustic wave resonance device 29, acoustic wave resonator 291 and acoustic wave resonator 292 are connected in parallel. Herein, overlap width (EL1) 29L1 of acoustic wave resonator 291 is smaller than overlap width (EL2) 29L2 of acoustic wave resonator 292. Furthermore, when overlap widths 29L1 and 29L2 have the relation expressed by mathematical formula Math. 1 or 2, transverse mode spurious responses can be distributed.

In particular, when acoustic wave resonators 291 and 292 are connected to the same series arm, transverse mode spurious responses generated in the acoustic wave resonators are strengthened by each other. The term "connected to the same series arm" herein denotes that acoustic wave resonators are connected to one series arm in series or in parallel like resonators 291 and 292 as shown in FIG. 17.

In particular, when pitch 29P1 of acoustic wave resonator 291 and pitch 29P2 of acoustic wave resonator 292 are substantially the same as each other, transverse mode spurious responses generated in the acoustic wave resonators are remarkably strengthened by each other. The term "pitch 29P1 of acoustic wave resonator 291 and pitch 29P2 of acoustic wave resonator 292 are substantially the same as each other" herein denotes that an absolute value of the difference between pitch 29P1 of acoustic wave resonator 291 and pitch 29P2 of acoustic wave resonator 292 is not more than any differences between pitch 29P1 of acoustic wave resonator 291 and pitches of any resonators other than acoustic wave resonator 292 in the acoustic wave resonance device.

In acoustic wave resonance device 90, acoustic wave resonator 901 and acoustic wave resonator 902 are connected in parallel. Herein, overlap width (GL1) 90L1 of acoustic wave resonator 901 is smaller than overlap width (GL2) 90L2 of acoustic wave resonator 902. Furthermore, when overlap widths 90L1 and 90L2 have the relation expressed by mathematical formula Math. 1 or 2, transverse mode spurious responses can be distributed.

In particular, when acoustic wave resonators 901 and 902 are connected to the same parallel arm, transverse mode spurious responses generated in acoustic wave resonators are strengthened by each other. The term "connected to the same parallel arm" herein denotes that acoustic wave resonators are connected to one parallel arm in series or in parallel as in resonators 901 and 902 shown in FIG. 17.

In particular, when pitch 90P1 of acoustic wave resonator 901 and pitch 90P2 of acoustic wave resonator 902 are substantially the same as each other, transverse mode spurious responses generated in acoustic wave resonators are remarkably strengthened by each other. The term "pitch 90P1 of acoustic wave resonator 901 and pitch 90P2 of acoustic wave resonator 902 are substantially the same as each other" herein denotes that an absolute value of the difference between pitch 90P1 of acoustic wave resonator 901 and pitch 90P2 of acoustic wave resonator 902 is not more than any differences between pitch 90P1 of acoustic wave resonator 901 and pitches of any resonators other than acoustic wave resonator 902 in the acoustic wave resonance device.

Furthermore, by allowing all the overlap widths 29L1, 29L2, 90L1, and 90L2 to be different, frequencies in which a transverse mode spurious response is generated in all the acoustic wave resonators can be distributed. Thus, loss in the pass band can be reduced effectively.

Furthermore, when any combinations of two of overlap widths 29L1, 29L2, 90L1, and 90L2 are allowed to have the relation expressed by mathematical formula Math. 1 or 2, ladder-type filter 28 can reliably prevent transverse mode spurious responses generated in the series arm and the parallel arm from overlapping in the same frequency. Thus, loss of the pass band can be reduced effectively.

It is desirable that |29L1−29L2|, which is an absolute value of the difference between overlap width 29L1 and overlap width 29L2, is larger than |90L1−90L2|, which is an absolute value of the difference between overlap width 90L1 and overlap width 90L2. FIG. 2 shows that as the phase velocity becomes larger (that is, as the frequency becomes higher), cycle SC in which transverse mode spurious responses are generated becomes smaller. In other words, as the frequency is higher, dependency on the overlap width is larger. Herein, in ladder-type filter 28, in order to allow the resonance frequencies of series-arm acoustic wave resonance devices 29 and 30 to substantially coincide with the anti-resonant frequencies in parallel-arm acoustic wave resonance devices 90, 91 and 92, the resonance frequencies of series-arm acoustic wave resonance devices 29 and 30 are set to relatively low, and anti-resonant frequencies of parallel-arm acoustic wave resonance devices 90, 91 and 92 are set to relatively high. Therefore, in series-arm acoustic wave resonance devices 29 and 30 in which the resonance frequency is relatively low, the absolute value |29L1−29L2| that is a difference in overlap widths of the acoustic wave resonator is made to be relatively large, and in parallel-arm acoustic wave resonance devices 90, 91 and 92 in which the resonance frequency is relatively high, the absolute value |90L1−90L2| that is a difference in overlap widths of the acoustic wave resonator is made to be relatively small. Thus, positions in which a transverse mode spurious response is generated can be distributed easily.

This exemplary embodiment describes a configuration in which two acoustic wave resonators 291 and 292 and two acoustic wave resonators 901 and 902 are connected in parallel in acoustic wave resonance devices 29 and 90, respectively. However, three or more acoustic wave resonators can be connected in parallel.

Figure 18:
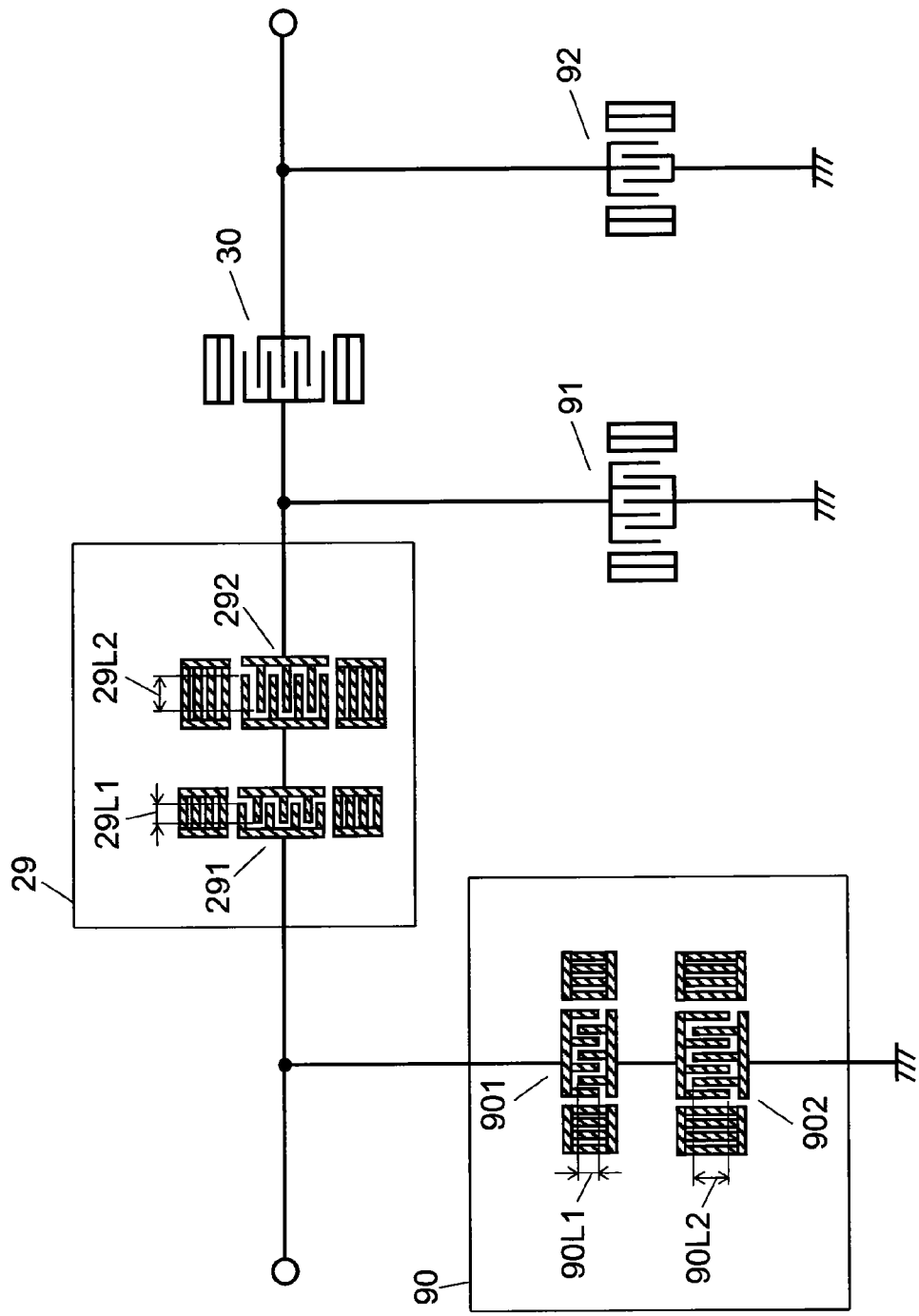
FIG. 18 is a top view showing another configuration of the acoustic wave resonance device.
Figure 19:
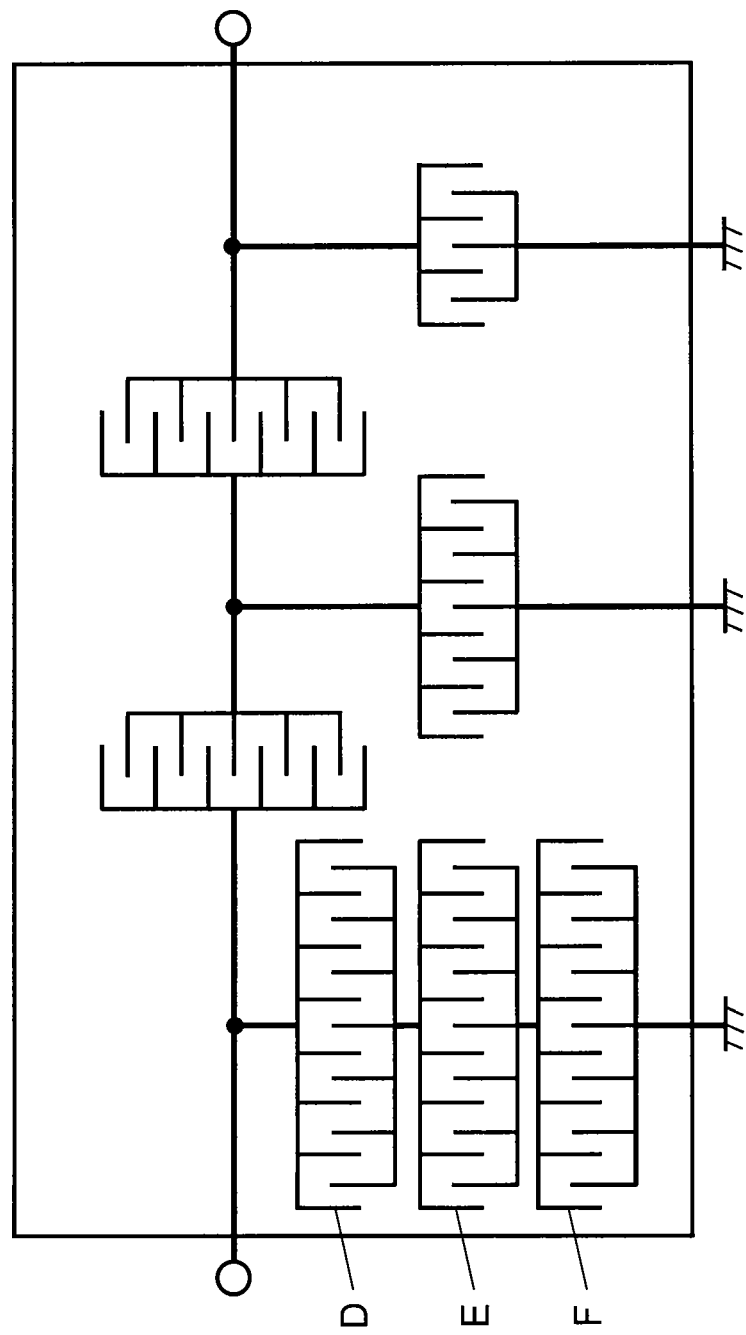
FIG. 19 is a top view showing a conventional acoustic wave resonance device.

This exemplary embodiment describes a configuration in which two acoustic wave resonators 291 and 292 and two acoustic wave resonators 901 and 902 are connected in parallel in acoustic wave resonance devices 29 and 90, respectively. However, acoustic wave resonators 291 and 292 and resonators 901 and 902 may be connected in series as shown in FIG. 18. Thus, a voltage applied to one acoustic wave resonator can be reduced, and the withstand voltage property of the acoustic resonance device can be improved. At the same time, when the overlap widths have the relation expressed by mathematical formula Math. 1 or 2, transverse mode spurious responses can be suppressed.

Note here that by allowing pitch 29P1 of acoustic wave resonator 291 and pitch 29P2 of acoustic wave resonator 292 to be equal to each other, and the resonance frequencies of the acoustic wave resonators to coincide with each other, loss can be minimized. On the contrary, by allowing pitches 29P1 and 29P2 to be different from each other, the bandwidths of the pass band and the attenuation band can be widened. Thus, the degree of freedom in designing can be increased. In this case, overlap widths 29L1 and 29L2 may be designed by taking pitches 29P1 and 29P2 into account. The same is true to pitch 90P1 of acoustic wave resonator 901 and pitch 90P2 of acoustic wave resonator 902.

Note here that it is desirable that a cut angle of a rotation-Y plate of the piezoelectric substrate formed in the lower part of these acoustic wave resonators is set to about −30° to +30°. When the cut angle is set to an angle in this range, a wide-band acoustic wave filter can be achieved.

Note here that when at least one of the interdigital transducer electrodes provided in these acoustic wave resonators is covered with a SiO$_2$ thin film having a thickness that is 15% or more of the wavelength of the acoustic wave, loss of the acoustic wave can be reduced. At the same time, the temperature property can be improved.

By configuring a transmitting filter and a receiving filter by using the configuration of this exemplary embodiment, a low-loss acoustic wave antenna duplexer can be configured.

An acoustic wave resonance device and an acoustic wave filter in accordance with the present invention can suppress an occurrence of loss due to transverse mode spurious responses, and therefore are useful in a variety of mobile communication equipment such as a portable telephone.

What is claimed is:

1. An acoustic wave resonance device comprising:
a piezoelectric substrate;
a first acoustic wave resonator provided on an upper surface of the piezoelectric substrate and including a first interdigital transducer electrode; and
a second acoustic wave resonator provided on the upper surface of the piezoelectric substrate and including a second interdigital transducer electrode,
wherein the first acoustic wave resonator and the second acoustic wave resonator are connected to each other, and
when an overlap width of a plurality of comb-shaped electrodes forming the first acoustic wave resonator is represented by L1, L2 that is an overlap width of a plurality of comb-shaped electrodes forming the second acoustic wave resonator satisfies a following mathematical formula:

$$L2 \neq L1 + nSC$$

wherein n represents an integer, and SC represents an amount of change of an overlap width in which transverse mode spurious responses are generated in a same frequency in the first acoustic wave resonator.

2. The acoustic wave resonance device of claim 1,
wherein the first acoustic wave resonator and the second acoustic wave resonator are connected in series.

3. The acoustic wave resonance device of claim 1,
wherein the first acoustic wave resonator and the second acoustic wave resonator are connected in parallel.

4. A ladder-type filter comprising:
a first acoustic wave resonance device that is a resonance device of claim 1 connected to a series arm; and
a second acoustic wave resonance device that is a resonance device of claim 1 connected to a parallel arm;
wherein when an overlap width of a first acoustic wave resonator provided in the first acoustic wave resonance device is represented by EL1,
an overlap width of a second acoustic wave resonator provided in the first acoustic wave resonance device is represented by EL2,
an overlap width of a first acoustic wave resonator provided in the second acoustic wave resonance device is represented by GL1, and
an overlap width of a second acoustic wave resonator provided in the second acoustic wave resonance device is represented by GL2,
EL1, EL2, GL1, and GL2 are all different, and
when smaller one of any two overlap widths selected from EL1, EL2, GL1 and GL2 is represented by L1, and larger one is represented by L2, following mathematical formula is satisfied:

$$L2 = L1 + nSC$$

wherein n represents an integer, and SC represents an amount of change of an overlap width in which transverse mode spurious responses are generated in a same frequency in an acoustic wave resonator having an overlap width of L1.

5. A ladder-type filter comprising:
a first acoustic wave resonance device that is a resonance device of claim 1 connected to a series arm; and
a second acoustic wave resonance device that is a resonance device of claim 1 connected to a parallel arm;
wherein when an overlap width of a first acoustic wave resonator provided in the first acoustic wave resonance device is represented by EL1,
an overlap width of a second acoustic wave resonator provided in the first acoustic wave resonance device is represented by EL2,
an overlap width of a first acoustic wave resonator provided in the second acoustic wave resonance device is represented by GL1, and
an overlap width of a second acoustic wave resonator provided in the second acoustic wave resonance device is represented by GL2,
EL1, EL2, GL1, and GL2 are all different, and
when smaller one of any two overlap widths selected from EL1, EL2, GL1 and GL2 is represented by L1, and larger one is represented by L2, following mathematical formula is satisfied:

$$L2 = L1 + (n + \tfrac{1}{2})SC$$

wherein n represents an integer, and SC represents an amount of change of an overlap width in which transverse mode spurious responses are generated in a same frequency in an acoustic wave resonator having an overlap width of L1.

6. A ladder-type filter comprising:
a first acoustic wave resonance device that is a resonance device of claim 1 connected to a series arm; and
a second acoustic wave resonance device that is a resonance device of claim 1 connected to a parallel arm;
wherein when an overlap width of a first acoustic wave resonator provided in the first acoustic wave resonance device is represented by EL1,
an overlap width of a second acoustic wave resonator provided in the first acoustic wave resonance device is represented by EL2,
an overlap width of a first acoustic wave resonator provided in the second acoustic wave resonance device is represented by GL1, and
an overlap width of a second acoustic wave resonator provided in the second acoustic wave resonance device is represented by GL2,
|EL1−EL2| that is an absolute value of a difference between EL1 and EL2 is larger than |GL1−GL2| that is an absolute value of a difference between GL1 and GL2.

7. An acoustic wave resonance device comprising:
a piezoelectric substrate;
a first acoustic wave resonator provided on an upper surface of the piezoelectric substrate and including a first interdigital transducer electrode; and
a second acoustic wave resonator provided on the upper surface of the piezoelectric substrate and including a second interdigital transducer electrode,
wherein the first acoustic wave resonator and the second acoustic wave resonator are connected to each other, and
when an overlap width of a plurality of comb-shaped electrodes forming the first acoustic wave resonator is represented by L1, L2 that is an overlap width of a plurality of comb-shaped electrodes forming the second acoustic wave resonator satisfies a following mathematical formula:

$$L2 = L1 + (n + \tfrac{1}{2})SC$$

wherein n represents an integer, and SC represents an amount of change of an overlap width in which transverse mode spurious responses are generated in a same frequency in the first acoustic wave resonator.

8. The acoustic wave resonance device of claim 7, wherein the first acoustic wave resonator and the second acoustic wave resonator are connected in series.

9. The acoustic wave resonance device of claim 7, wherein the first acoustic wave resonator and the second acoustic wave resonator are connected in parallel.

* * * * *